US007081939B2

(12) United States Patent
Kim

(10) Patent No.: US 7,081,939 B2
(45) Date of Patent: Jul. 25, 2006

(54) DISPLAY DEVICE HAVING A BLACK MATRIX OVERLAPPING A GATE CONTROL SIGNAL LINE FORMED ON SUBSTRATE

(75) Inventor: Dong-Gyu Kim, Suwon (KR)

(73) Assignee: Samsung Electronics Ltd., Gyeonggi-do (KR)

( * ) Notice: Subject to any disclaimer, the term of this patent is extended or adjusted under 35 U.S.C. 154(b) by 0 days.

(21) Appl. No.: 10/999,986

(22) Filed: Dec. 1, 2004

(65) Prior Publication Data

US 2005/0157221 A1 Jul. 21, 2005

Related U.S. Application Data

(63) Continuation of application No. 09/964,639, filed on Sep. 28, 2001, now Pat. No. 6,888,585.

(30) Foreign Application Priority Data

Oct. 31, 2000 (KR) ............................... 2000-64396

(51) Int. Cl.
*G02F 1/1345* (2006.01)
*G02F 1/1333* (2006.01)

(52) U.S. Cl. ...................... 349/152; 349/110; 349/111; 349/149

(58) Field of Classification Search ............... 349/43, 349/149–152, 110, 111; 257/59, 72
See application file for complete search history.

(56) References Cited

U.S. PATENT DOCUMENTS

| 5,148,301 | A | * | 9/1992 | Sawatsubashi et al. ..... 349/153 |
| 5,208,690 | A | | 5/1993 | Hayashi et al. ............. 349/143 |
| 5,737,053 | A | * | 4/1998 | Yomogihara et al. ....... 349/149 |
| 5,739,880 | A | | 4/1998 | Suzuki et al. ............... 349/110 |
| 5,909,035 | A | | 6/1999 | Kim ............................ 257/59 |
| 5,914,758 | A | | 6/1999 | Kishida et al. ............... 349/51 |
| 6,005,652 | A | * | 12/1999 | Matsuhira .................. 349/149 |
| 6,097,457 | A | | 8/2000 | Kim et al. .................. 349/110 |
| 6,104,465 | A | | 8/2000 | Na et al. .................... 349/152 |
| 6,172,721 | B1 | | 1/2001 | Murade et al. ............... 349/43 |
| 6,300,997 | B1 | * | 10/2001 | Saito et al. ................. 349/149 |
| 6,636,288 | B1 | * | 10/2003 | Kim et al. .................. 349/139 |
| 6,861,297 | B1 | * | 3/2005 | Kwak et al. ................ 438/149 |
| 2001/0026345 | A1 | | 10/2001 | Park et al. .................. 349/149 |
| 2002/0008798 | A1 | * | 1/2002 | Song et al. ................... 349/43 |
| 2002/0093616 | A1 | | 7/2002 | Park et al. .................. 349/149 |

FOREIGN PATENT DOCUMENTS

JP 9-211480 * 8/1997

* cited by examiner

*Primary Examiner*—Tarifur R. Chowdhury
(74) *Attorney, Agent, or Firm*—MacPherson Kwok Chen & Heid LLP

(57) ABSTRACT

A control signal unit includes a substrate, a signal line formed on the substrate, and an insulating layer covering the signal line. A contact hole exposes the signal line with a predetermined width. The contact hole has a lateral side bordering on the signal line. The lateral side of the contact hole is longer than the width of the contact hole. A subsidiary signal pad is connected to the signal line through the contact hole.

9 Claims, 57 Drawing Sheets

270   280   220

270   280   220

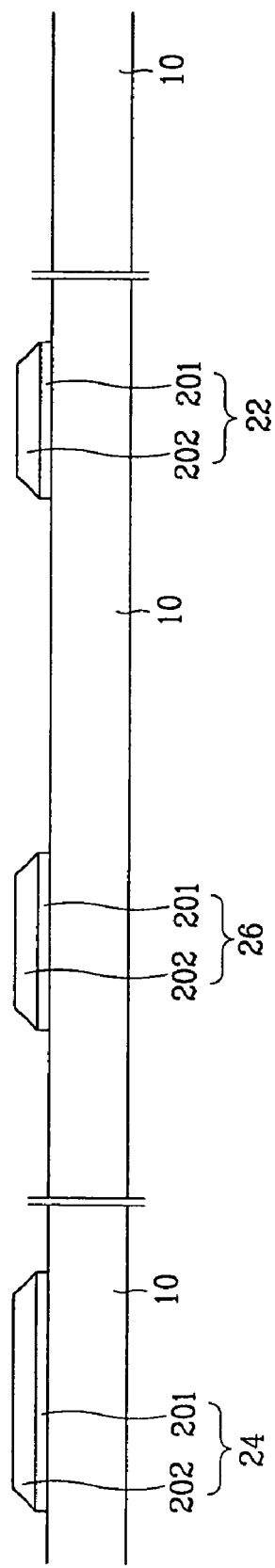

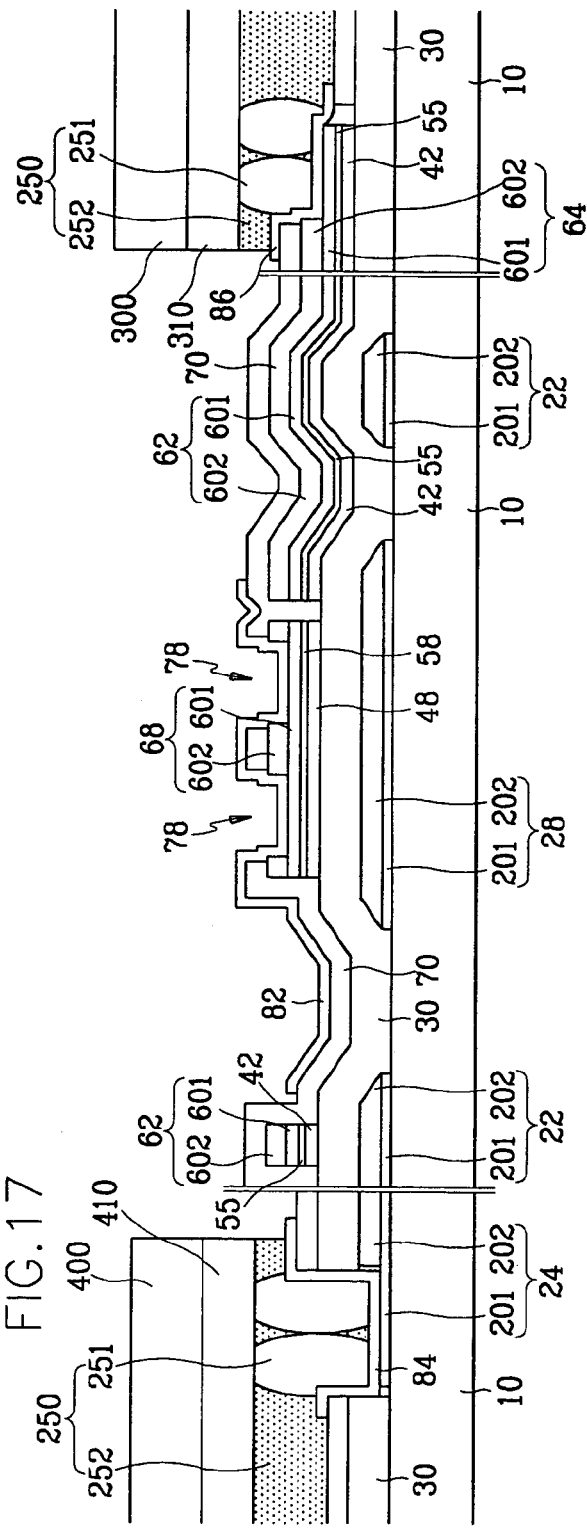

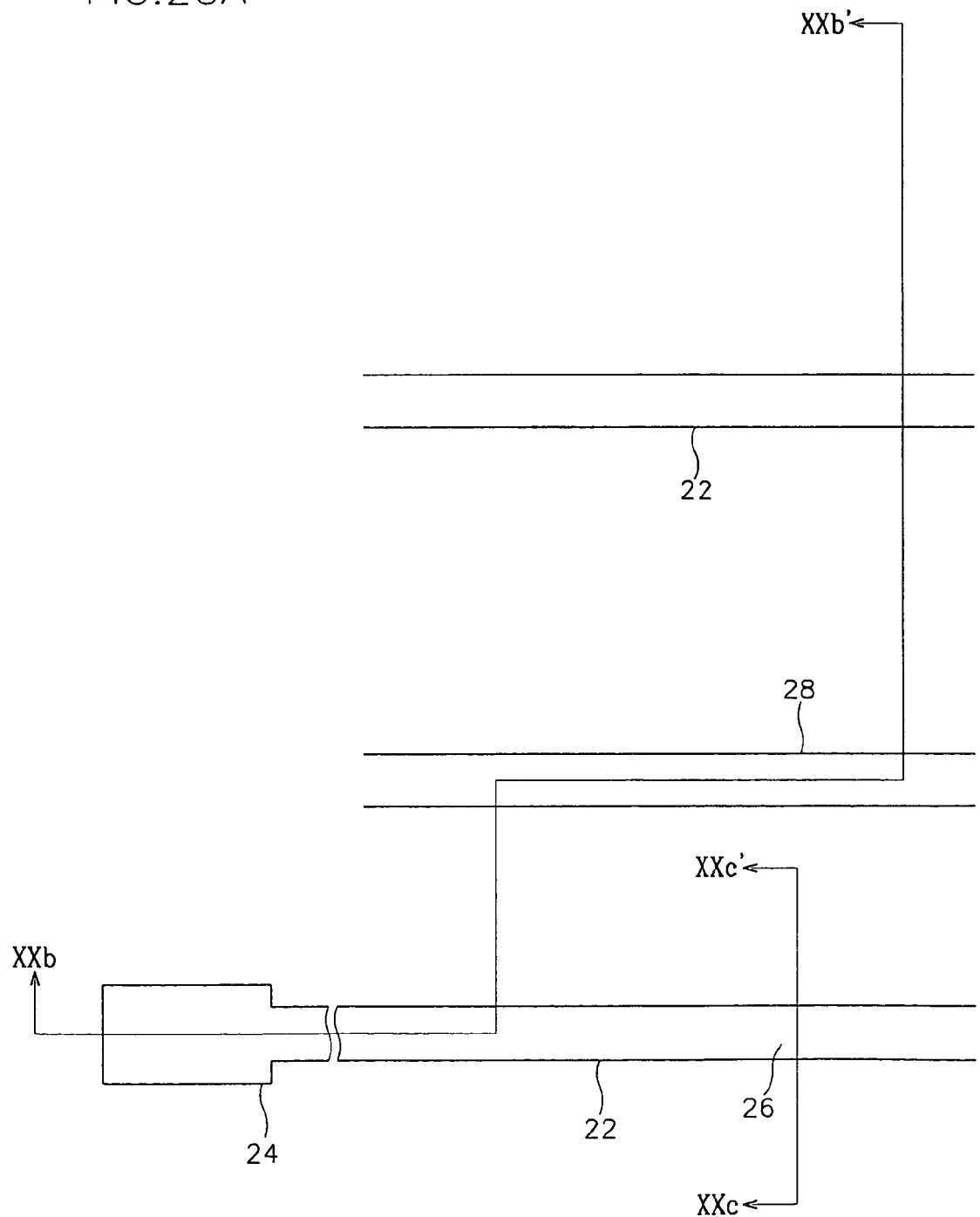

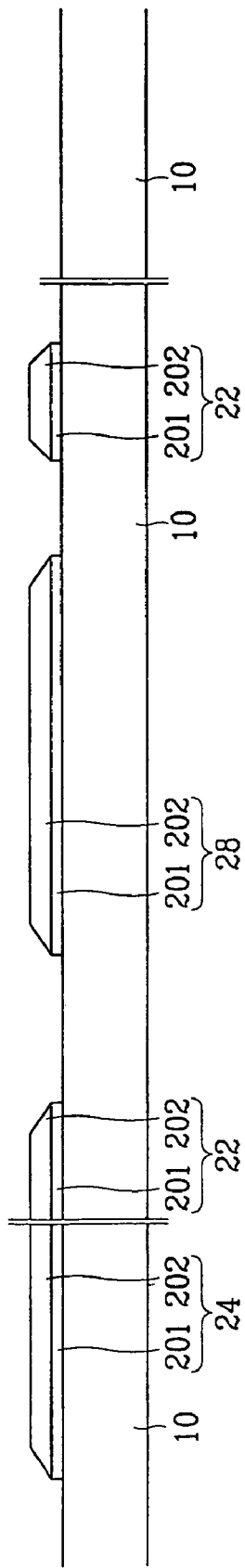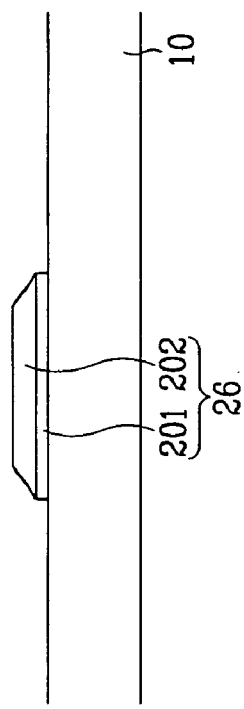

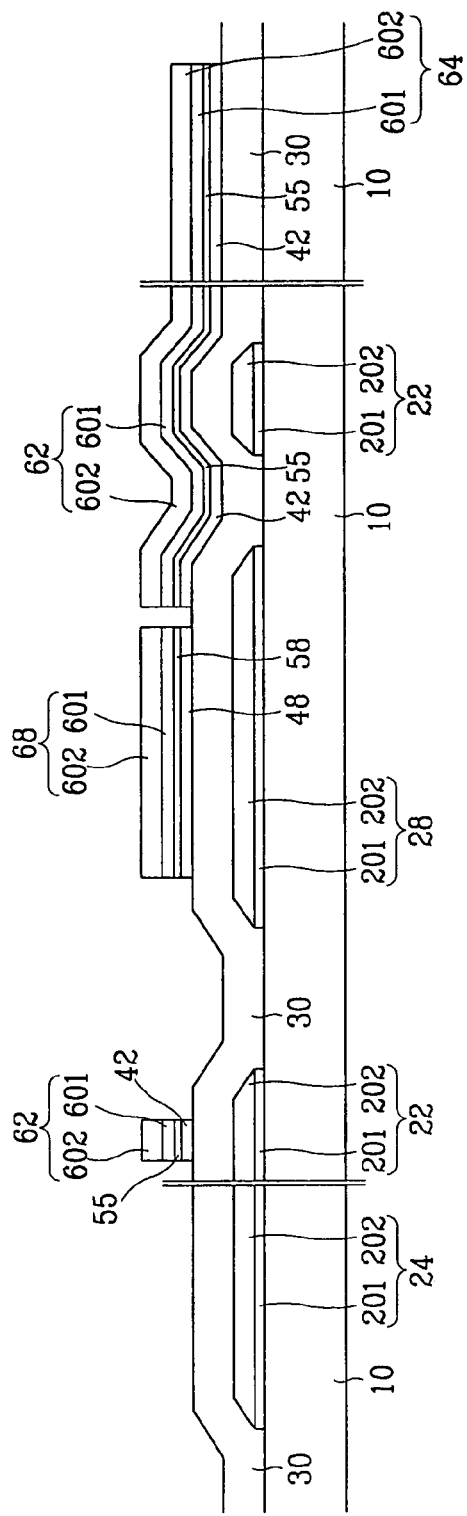
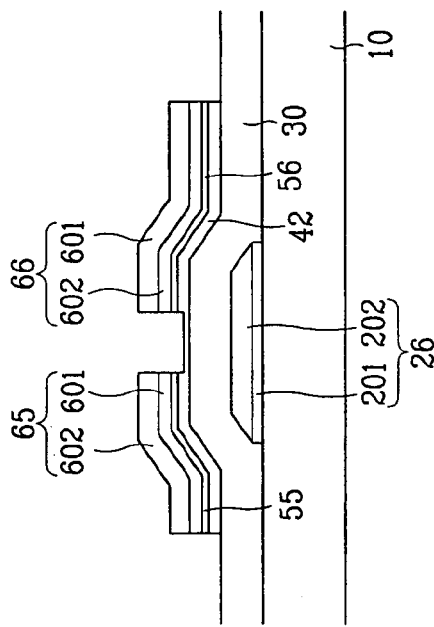
FIG.21C
FIG.21D

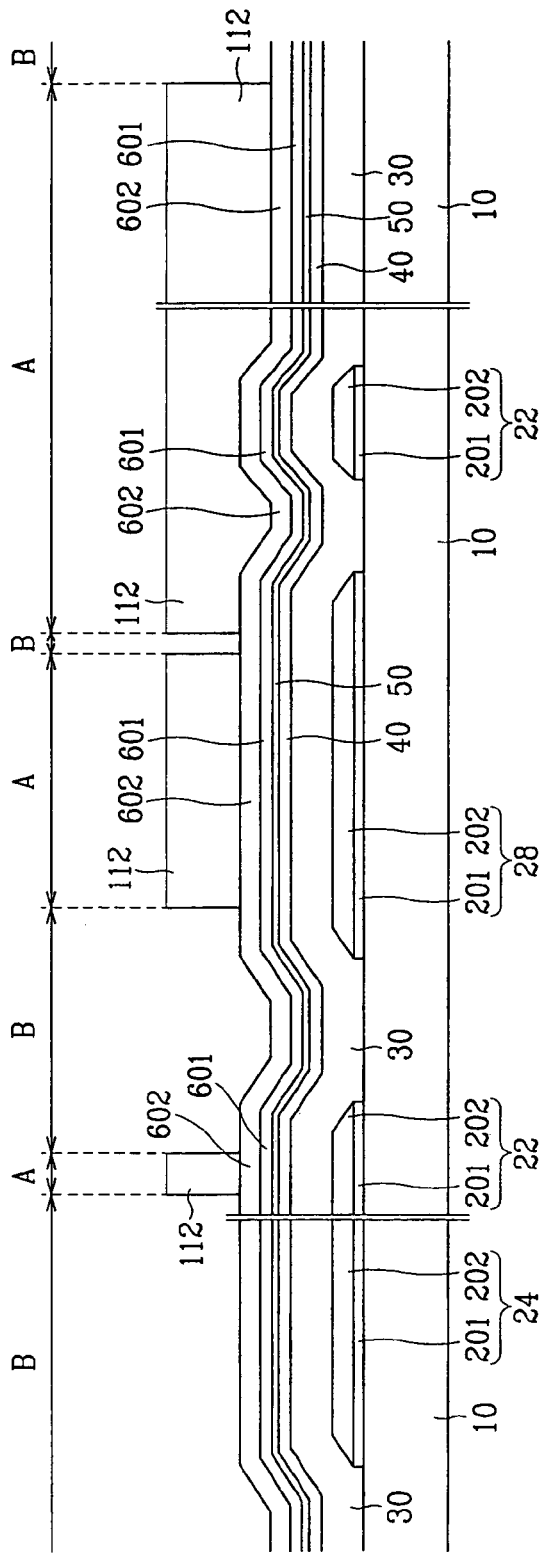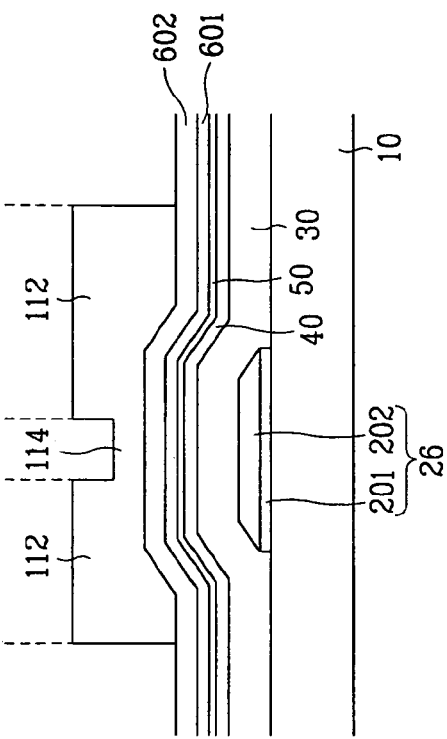

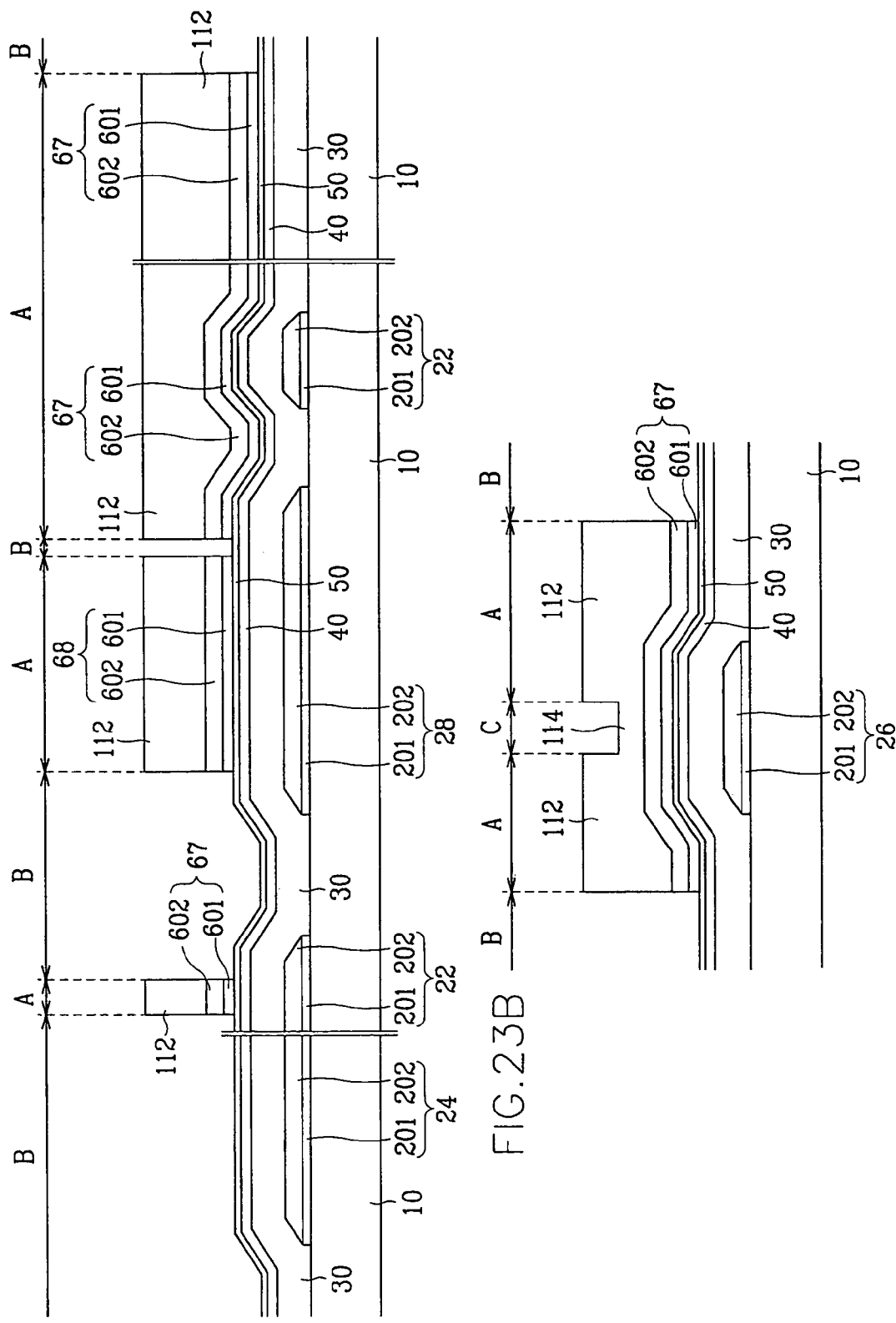

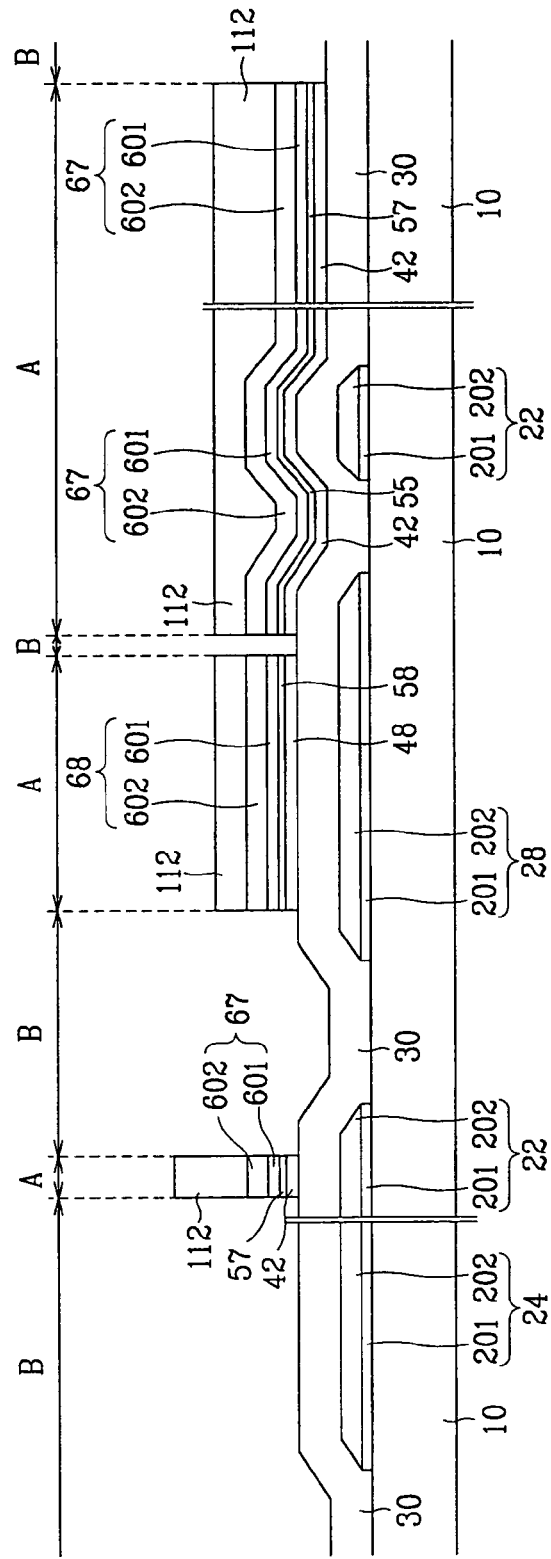

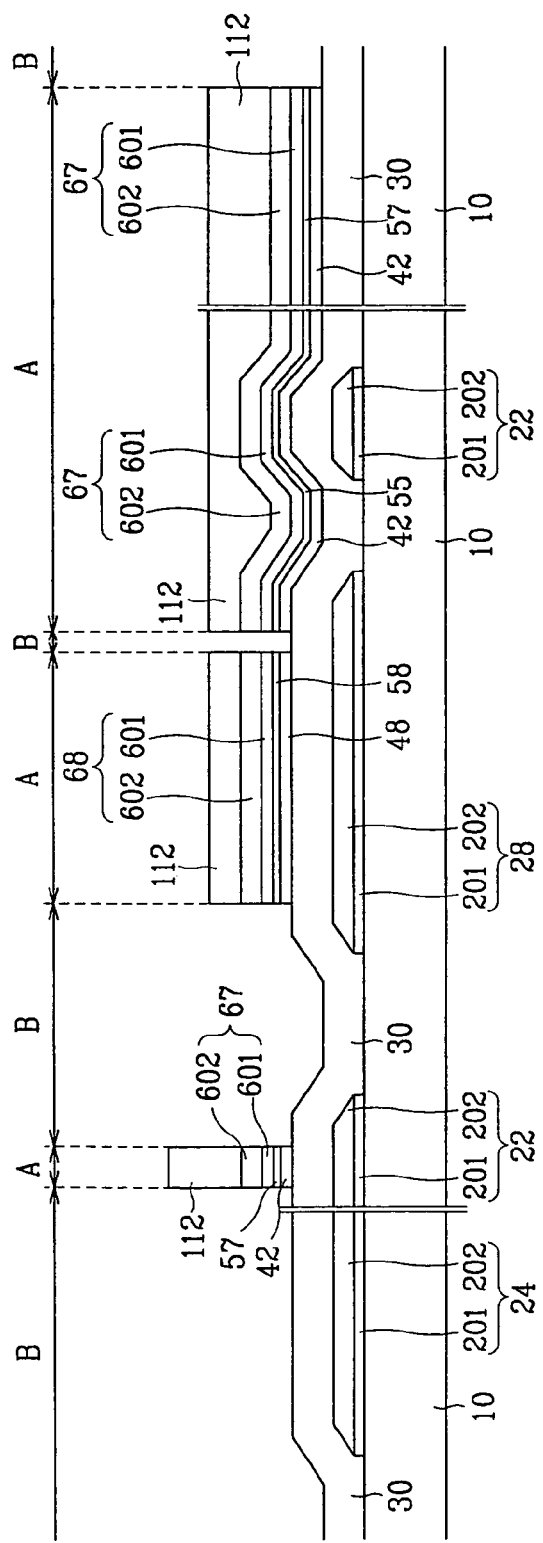

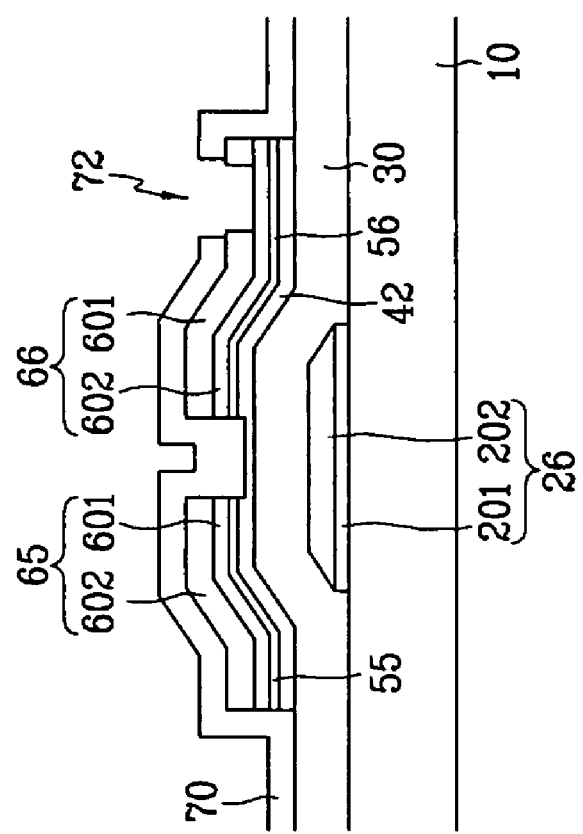

DISPLAY DEVICE HAVING A BLACK MATRIX OVERLAPPING A GATE CONTROL SIGNAL LINE FORMED ON SUBSTRATE

CROSS REFERENCE TO PRIOR APPLICATION

This application is a continuation application from U.S. patent application Ser. No. 09/964,639, filed Sep. 28, 2001, now U.S. Pat. No. 6,888,585 which claims priority to and the benefit of Korean Patent Application No. 2000-64396, filed on Oct. 31, 2000, which are all hereby incorporated by reference for all purposes as if fully set forth herein.

BACKGROUND OF THE INVENTION (a) Field of the Invention

The present invention relates to a control signal unit for a liquid crystal display and a method for fabricating the same and, more particularly, to a control signal unit for a liquid crystal display operating in a stable manner without line opening.

(b) Description of the Related Art

Generally, a liquid crystal display (LCD) has two glass substrates with electrodes, and a liquid crystal sandwiched between the substrates. When voltage is applied to the electrodes, the liquid crystal molecules are rearranged, thereby controlling light transmission.

One of the substrates has color filters, and the other substrate has thin film transistors (TFTs). The former substrate is usually called the "color filter substrate," and the latter substrate called the "TFT array substrate."

The display area is positioned at the center of the TFT array substrate. In the display area, a plurality of gate lines are formed in the horizontal direction, and a plurality of data lines cross over the gate lines to form pixel regions in a matrix type. The TFT is formed at each pixel region together with a pixel electrode such that it is electrically connected to the gate line and the data line. The TFT controls the data signals from the data line in accordance with the gate signals from the gate line, and sends the controlled signals to the pixel electrode.

A plurality of gate pads and data pads are formed externally to the display area such that they are connected, on the one hand, to the gate lines and the data lines, and on the other, directly to external driving ICs. The gate pad and the data pad receive the gate signal and the data signal respectively from the driving ICs, and send them to the gate line and the data line.

A gate printed circuit board, and a data printed circuit board are connected to the TFT array substrate to transmit the gate signal and the data signal thereto. Data signal transmission films interconnect the TFT array substrate and the data printed circuit board while mounting with data driving ICs for converting electrical signals into data signals and outputting the data signals to the data lines. Furthermore, gate signal transmission films interconnect the TFT array substrate and the gate printed circuit board while mounting with gate driving ICs for converting electrical signals into gate signals and outputting the gate signals to the gate lines.

Alternatively, without a gate printed circuit board, the data printed circuit board may output the gate control signals to the gate driving ICs of the gate signal transmission films via the TFT array substrate, thereby controlling the gate driving signals.

The gate control signals include various kinds of control signals such as gate on voltages (Von) and gate off voltages (Voff), and common voltages Vcom.

The control signal lines carrying such gate control signals are formed with a low resistance conductive material capable of rapidly carrying the signals. Aluminum is commonly used for that purpose, but bears unstable physical and chemical properties. Therefore, the control signal lines have a double or triple-layered structure with an aluminum-based layer and other layers based on metallic materials bearing relatively high resistance.

In case indium tin oxide (ITO) is used to form pixel electrodes and pads, since the aluminum-based material bears poor contact characteristic with respect to the ITO, the aluminum-based layer should be removed at the contact area.

The control signal lines may be processed in the following way. A metallic layer and an aluminum-based layer are sequentially deposited onto a substrate, and etched through photolithography to form a double-layered signal line. An insulating layer is then deposited onto the substrate such that it covers the double-layered signal lines. Contact holes are formed at the insulating layer, and the aluminum-based layer of the signal lines exposed through the contact holes are removed through etching. Subsidiary pads are formed on the exposed portions of the metallic layer. In the processing step where the exposed portion of the aluminum-based layer is completely removed, the non-exposed portion of the aluminum-based layer under the insulating layer is partially etched inside of the insulating layer while forming undercut regions.

Meanwhile, when strong static electricity is generated at the device, the static electricity is accumulated at the gate off voltage line and the common voltage line bearing relatively high capacity. In the process of discharging the static electricity, surge current accruing to the discharge of the static electricity is flown along the gate off voltage line and the common voltage line, and this generates Joule heat.

Particularly, the voltage drop is intensified at the undercut regions because an aluminum-based layer or other conductive layers capable of receiving the static electricity is absent at those regions. Accordingly, the voltage drop is focused at the undercut regions, and large amount of Joule heat is generated there. The Joule heat may melt the metallic layer and result in line opening.

SUMMARY OF THE INVENTION

It is an object of the present invention to provide a liquid crystal display with a control signal unit which can prevent line opening due to the discharge of static electricity.

This and other objects may be achieved by a liquid crystal display having a control signal unit with the following features.

According to one aspect of the present invention, the control signal unit includes a substrate, a signal line formed on the substrate, and an insulating layer covering the signal line. A contact hole exposes the signal line with a predetermined width. The contact hole has a lateral side bordering on the signal line. The lateral side of the contact hole has a length greater than the width of the contact hole. A subsidiary signal pad is connected to the signal line through the contact hole. The lateral side of the contact hole has an inclined portion proceeding in the direction of the width. The contact hole has a protruded portion proceeding in the longitudinal direction of the signal line. At least one side of the protruded portion is overlapped with the signal line.

The signal line has a double-layered structure with an under-layer and an over-layer, and the contact hole is formed at the insulating layer, and the over-layer of the signal line. The over-layer of the signal line is formed with an aluminum-based metallic material.

According to another aspect of the present invention, the control signal unit includes a substrate, a plurality of signal lines formed on the substrate, an insulating layer covering the signal lines. Contact holes exposes the respective signal lines each with a predetermined width. The contact hole has a lateral side bordering on the signal line. The lateral side of the contact hole has a length greater than the width of the contact hole. Subsidiary signal pads are connected to the respective signal lines through the respective contact holes.

The control signal unit further includes a signal transmission film with signal leads. The signal leads are connected to the signal lines in one to one correspondence. The signal leads of the signal transmission film include a first signal lead carrying high voltage signals and a second signal lead carrying low voltage signals, and a dummy lead is formed between the first and the second signal leads. The same voltage is applied to the dummy lead and the first signal lead. The dummy lead has a thickness of several to several tens micrometers.

A dummy line corresponding to the dummy lead is formed at the substrate. The dummy line is formed of a conductive material that is less oxidative than the signal line.

According to still another aspect of the present invention, the liquid crystal display with the control signal unit includes a substrate, and a gate line assembly and a plurality of signal lines formed on the substrate. The gate line assembly has gate electrodes and gate lines. A gate insulating layer covers the gate line assembly and the signal lines. Thin film transistor semiconductor patterns are formed on the gate insulating layer. A data line assembly has data lines crossing over the gate lines while being insulated from the gate lines, source electrodes extended from the data lines while contacting the semiconductor patterns, and drain electrodes contacting the semiconductor patterns in correspondence with the source electrodes. A protective layer covers the data line assembly and the semiconductor patterns. First contact holes expose the drain electrodes, and second contact holes exposes the respective signal lines with a predetermined width. The second contact hole has a lateral side bordering on the signal line. The lateral side of the second contact hole has a length greater than the width of the second contact hole. Pixel electrodes and subsidiary signal pads are standing in the same plane. The pixel electrodes are connected to the drain electrodes, and the subsidiary signal pads are connected to the signal lines.

The gate line assembly and the signal lines have a double-layered structure with an aluminum-based layer. The second contact holes are formed at the gate insulating layer, the protective layer, and the aluminum-based layer of the signal lines. The liquid crystal display further includes a signal transmission film with signal leads. The signal leads are connected to the signal lines in one to one correspondence. The signal leads of the signal transmission film include a first signal lead carrying high voltage signals and a second signal lead carrying low voltage signals, and a dummy lead is formed between the first and the second signal leads. The same voltage is applied to the dummy lead and the first signal lead. The dummy lead is several to several tens micrometers thick. A dummy line corresponding to the dummy lead is formed at the substrate. The dummy line is formed with a conductive material that is less oxidative than the signal line. A gate pad is connected to each gate line as a component of the gate line assembly, and a data pad is connected to each data line as a component of the data line assembly. A third contact hole exposes the gate pad with a predetermined width, and a fourth contact hole exposes the data pad with a predetermined width. A subsidiary gate pad covers the gate pad at the first contact hole, and a subsidiary data pad covers the data pad at the fourth contact hole. Each of the third and the fourth contact holes has a lateral side bordering on the pad. The lateral side of the contact hole has a length greater than the width of the contact hole.

The liquid crystal display further includes common voltage pads formed at the substrate. The common voltage pads are covered by one insulating layer among the gate insulating layer and the protective layer. Contact holes are formed at the insulating layer with a predetermined width while exposing the common voltage pads. Each contact hole has a lateral side bordering on the pad. The lateral side of the contact hole has a length greater than the width of the contact hole. Subsidiary common voltage pads are connected to the common voltage pads through the contact holes.

The liquid crystal display further includes a color filter substrate with a common electrode. The common electrode is connected to the subsidiary common voltage pads.

In a method for fabricating such a liquid crystal display, a gate line assembly and signal lines are formed on a substrate. The gate line assembly has gate electrodes and gate lines. A gate insulating layer is formed while covering the gate line assembly and the signal lines. Semiconductor patterns are formed on the gate insulating layer. A data line assembly comprises data lines crossing over the gate lines, source electrodes contacting the one-sided semiconductor patterns, and drain electrodes contacting the other-sided semiconductor patterns in correspondence with the source electrodes. A protective layer is formed while covering the data line assembly and the semiconductor patterns. First and second contact holes are formed with a predetermined width such that the first contact holes expose the drain electrodes, and the second contact holes expose the signal lines. Pixel electrodes and subsidiary signal pads are formed such that the pixel electrodes are connected to the drain electrodes through the first contact holes, and the subsidiary signal pads are connected to the signal lines through the second contact holes.

Each second contact hole has a lateral side bordering on the signal line. The lateral side of the contact hole has a length greater than the width of the contact hole. The signal lines have a double-lined structure with an aluminum-based layer. The second contact holes are formed through dry-etching the gate insulating layer and the protective layer covering the signal lines while exposing the aluminum-based layer, and wet-etching the exposed portions of the aluminum-based layer using an aluminum etching solution.

The gate line assembly further has gate pads connected to the gate lines, and the data line assembly further has data pads connected to the data lines. Third and fourth contact holes are formed with a predetermined width at the step of forming the first and the second contact holes such that the third contact holes expose the gate pads, and the fourth contact holes expose the data pads. Subsidiary gate pads and subsidiary data pads at the step of forming the drain electrodes and the subsidiary signal pads such that the subsidiary gate pads cover the gate pads, and the subsidiary data pads cover the data pads.

Each of the third and the fourth contact holes has a lateral side bordering on the pad. The lateral side of the contact hole has a length greater than the width of the contact hole.

The semiconductor patterns and the data line assembly are formed together using photoresist patterns having different thickness. The photoresist patterns include a first photoresist pattern placed over the data line assembly with a first thickness, and a second photoresist pattern placed over the channel portion between the source electrode and the drain electrode with a second thickness. The second thickness is smaller than the first thickness.

The formation of the semiconductor patterns and the data line assembly is made in the following way. A semiconductor layer and a conductive layer are deposited onto the gate insulating layer, and the photoresist patterns are formed on the conductive layer. The conductive layer is etched using the photoresist patterns as a mask such that the semiconductor layer is partially exposed to the outside. The exposed portions of the semiconductor layer and the second photoresist pattern are removed to thereby complete the semiconductor patterns while exposing the portions of the conductive layer placed between the source electrode and the drain electrode. The exposed portions of the conductive layer is removed to thereby complete the data line assembly, and the first photoresist pattern is removed. The photoresist patterns are made using a mask with first to third regions. The first region of the mask has a light transmission higher than the second region but lower than the third region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIGS. 10A, 10B, 10C, 10D, 11A, 11B, 11C, 11D, 12A, 12B, 12C, 12D, 13A, 13B, 13C, 13D, 14A, 14B, 14C and 14D illustrate the steps of fabricating the liquid crystal display shown in FIG. 5;

FIG. 17 is a cross sectional view of the liquid crystal display taken along the XVII–XVII' line of FIG. 15;

FIG. 18 is a cross sectional view of the liquid crystal display taken along the XVIII–XVIII' line of FIG. 15;

FIGS. 20A, 20B, 20C, 20D, 20E, 21A, 21B, 21C, 21D, 21E, 22A, 22B, 22C, 23A, 23B, 23C, 24A, 24B, 24C, 25A, 25B, 25C, 26A, 26B, 26C, 26D, 26E, 27A, 27B, 27C, 27D and 27E illustrate the steps of fabricating the liquid crystal display shown in FIG. 15.

DETAILED DESCRIPTION OF THE PREFERRED EMBODIMENTS

Preferred embodiments of this invention will be explained with reference to the accompanying drawings.

Figure 1:
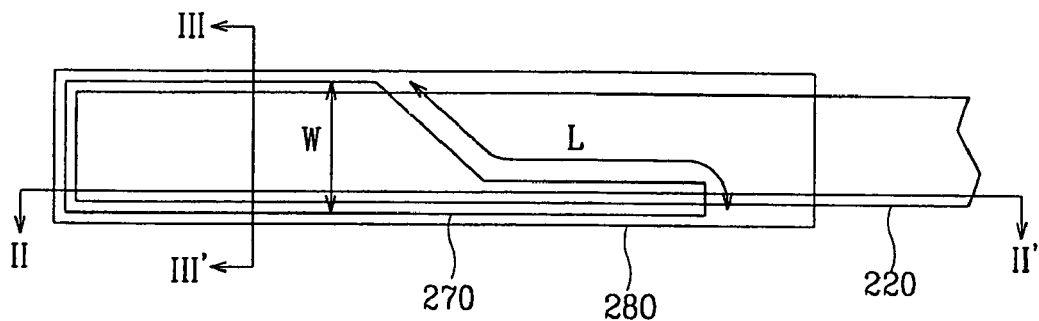
FIG. 1 is a plan view of a control signal unit according to a first preferred embodiment of the present invention.
Figure 2:
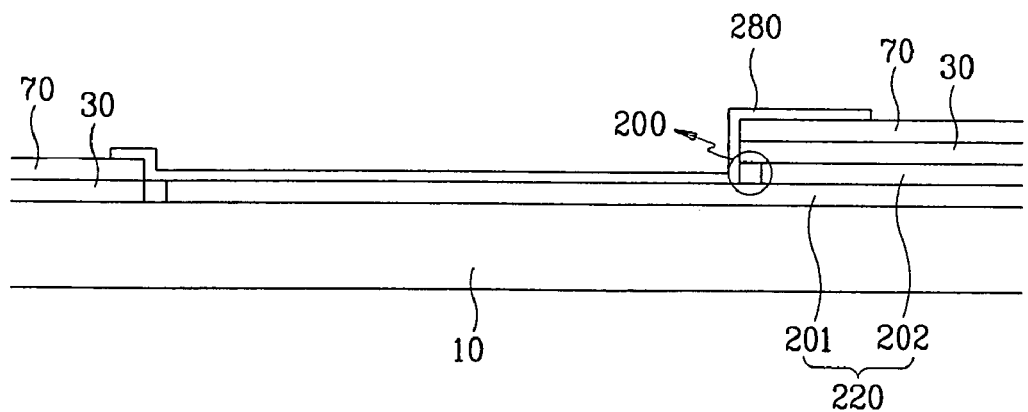
FIG. 2 is a cross sectional view of the control signal unit taken along the II–II' line of FIG. 1.
Figure 3:
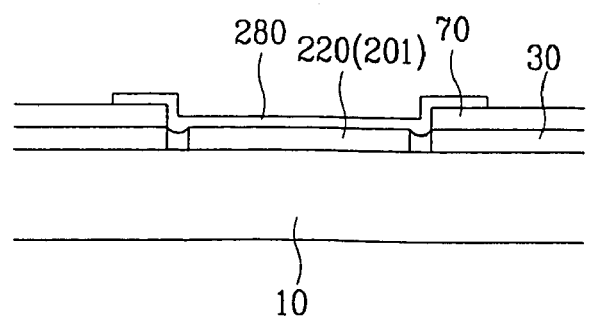
FIG. 3 is a cross sectional view of the control signal unit taken along the III–III' line of FIG. 1.

FIG. 1 is a plan view of a control signal unit according to a first preferred embodiment of the present invention, and FIGS. 2 and 3 are cross sectional views of the control signal unit taken along the II–II' line and the III–III' line of FIG. 1, respectively.

A control signal line 220 for the control signal unit is formed on a substrate 10, and bears a double-layered structure with a chrome-based layer 201 and an aluminum-based layer 202. The chrome-based layer 201 is 500–1500 Å thick, and the aluminum-based layer 202 is 2500–3500 Å thick.

A first insulating layer 30 and a second insulating layer 70 are sequentially formed on the substrate 10 while covering the control signal line 220. A contact hole 270 is formed at the first and second insulating layers 30 and 70, and at the aluminum-based layer 202 of the control signal line 220 while exposing the chrome-based layer 201.

The contact hole 270 is roughly outlined along the shape of the control signal line 220 such that the length L of the lateral side of the contact hole 270 bordering on the control signal line 220 becomes to be greater than the width W of the contact hole 270. For instance, as shown in FIG. 1, one lateral side of the contact hole 270 is partially inclined in the direction of width such that the boundary between the contact hole 270 and the control signal line 220 is elongated.

In order to elongate the boundary between the contact hole 270 and the control signal line 220, the contact hole 270 may have a protruded portion. As shown in FIG. 1, the protruded portion of the contact hole 270 is positioned at the bottom of the control signal line 220. It is preferable that at least one side of the protruded portion is overlapped with the control signal line 220.

Figure 4A:
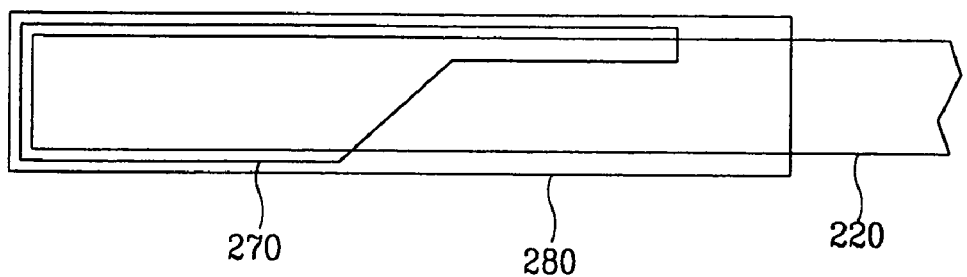
FIG. 4A illustrates a variation of the control signal unit shown in FIG. 1.
Figure 4B:
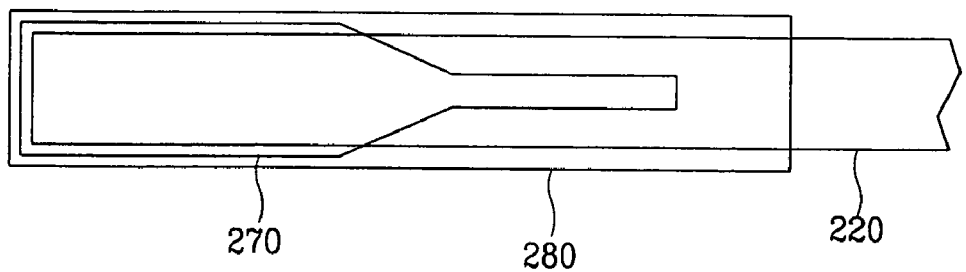
FIG. 4B illustrates another variation of the control signal unit shown in FIG. 1.

Alternatively, as shown in FIGS. 4A and 4B, the protruded portion of the contact hole 220 may be positioned at the top of the control signal line 220, or at the center thereof.

The contact hole 270 exposing the control signal line 220 is formed through dry-etching the first and second insulating layers 30 and 70 while exposing the underlying aluminum-based layer 202, and wet-etching the exposed portion of the aluminum-based layer 202. In the wet-etching process, the non-exposed portion of the aluminum-based layer 202 under the insulating layers 30 and 70 is also etched inside of the insulating layers 30 and 70 to thereby form undercut regions 200. Thereafter, a control signal subsidiary pad 280 is formed on the second insulating layer 70 such that it covers the chrome-based layer 201 exposed through the contact hole 270. The control signal subsidiary pad 280 may be formed with a transparent conductive material such as indium tin oxide (ITO) and indium zinc oxide (IZO).

The control signal line 220 is attached to a signal lead of a signal transmission film for signal communication.

Meanwhile, when strong static electricity is generated at the device, the static electricity is accumulated at the gate off voltage line and the common voltage line bearing relatively high capacity. In the process of discharging the static electricity, surge current accruing to the discharge of the static electricity is flown along the gate off voltage line and the common voltage line. This generates Joule heat.

Particularly, the portions of the chrome-based layer 201 placed at the undercut regions 200 significantly suffer voltage drop because the aluminum-based layer 202 capable of receiving the static electricity is absent at those portions. In this case, large amount of Joule heat accruing to the voltage drop is generated there. However, in this preferred embodiment, the sufficiently elongated boundary between the chrome-based layer 201 and the control signal line 220 can significantly reduce the volume of voltage drop. Hence, the amount of Joule heat is also decreased, thereby preventing opening of the control signal line 220.

The amount of Joule heat can be obtained by the following formula:

Joule heat ∝ R where R=D/L, D indicates the vertical distance for the movement of the electric potential, that is, the width of the chrome-based layer at the undercut region, and L indicates the horizontal distance for the movement of the electric potential, that is, the boundary between the chrome-based layer and the aluminum-based layer at the undercut region, i.e., the lateral side of the contact hole bordering on the control signal line.

In the inventive control signal unit, since the boundary between the chrome-based layer and the aluminum-based layer at the undercut region 200 is elongated, the resistance of the metallic layer that becomes to be an obstacle to the movement of surge current is reduced, decreasing the amount of Joule heat.

For example, in case the width of the control signal line is 23 μm, and the lateral side of the contact hole 270 is elongated to be 230 μm while being inclined in the direction of width of the control signal line 220, the amount of Joule heat per unit length occurred at the chrome-based layer 201 can be reduced at minimum by ¹/₁₀ compared to the case where the lateral side of the contact hole is formed in the same way as in the direction of width of the control signal line.

Alternatively, the contact hole 270 may be formed to be smaller than the control signal line 220 such that it is placed within the area of the control signal line 220. Furthermore, the contact hole 270 may bear various shapes provided that the lateral side of the contact hole 270 bordering on the control signal line 220 is longer than the width of the contact hole 270.

Figure 5:
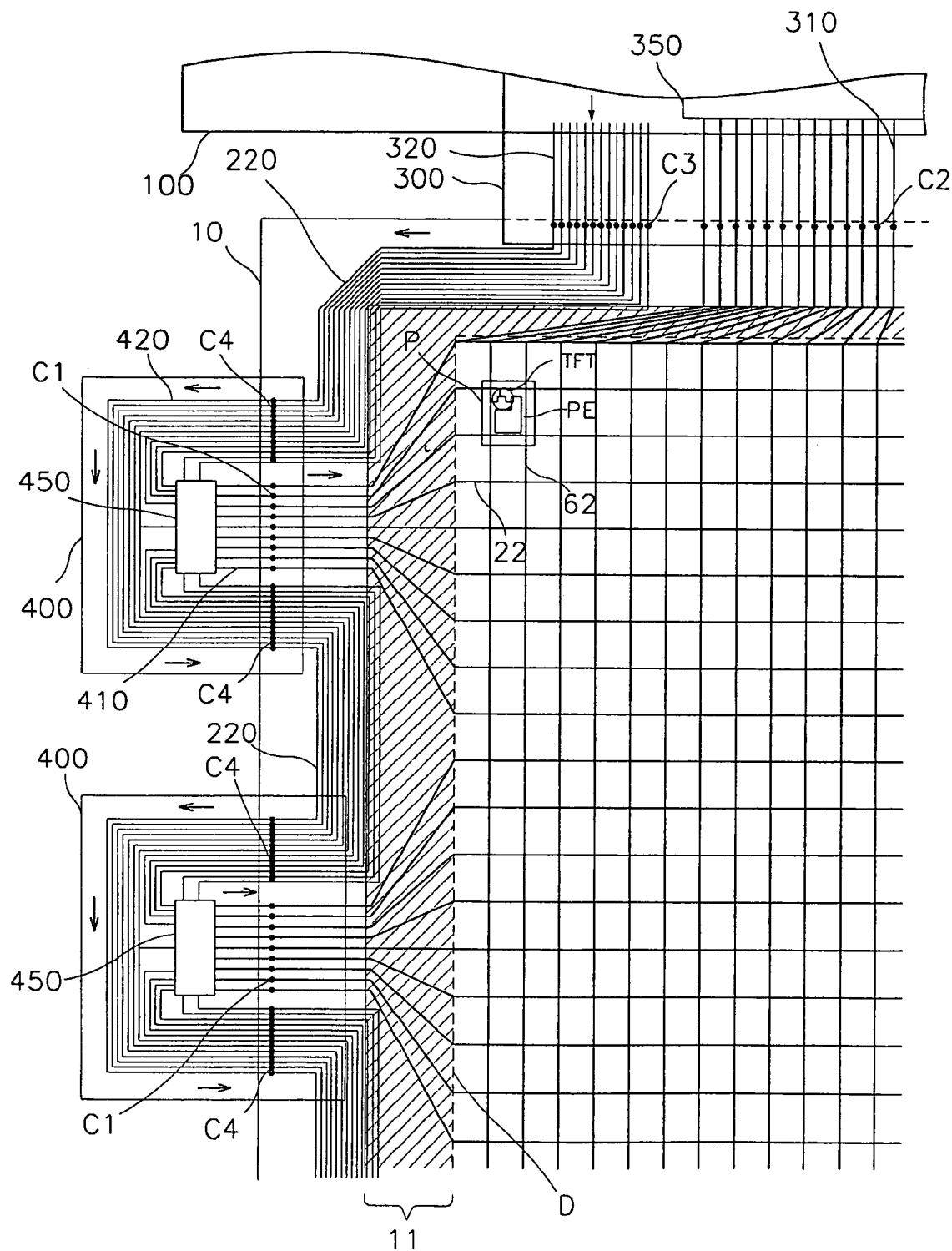
FIG. 5 is a schematic view of a liquid crystal display with a control signal unit according to a second preferred embodiment of the present invention.

FIG. 5 is a schematic view of a liquid crystal display with a control signal unit according to a second preferred embodiment of the present invention.

As shown in FIG. 5, a plurality of gate lines 22 are formed on a substrate 10 in the horizontal direction. And a plurality of data lines 62 cross over the gate lines 22 while forming pixel regions P in a matrix type. The display area D is defined by the sum of the pixel regions P. The data lines 62 proceed in the vertical direction while being insulated from the gate lines 22.

A thin film transistor (TFT) is formed at each pixel region P such that it is connected to the gate line 22 and the data line 62. A pixel electrode (PE) is also formed at the pixel region P such that it is connected to the TFT. A black matrix 11 is formed at the outside of the display area (at the deviant lined area in the drawing) to prevent leakage of light.

A printed circuit board 100 is formed at the top of the substrate 10 to output gate signals and data signals. The substrate 10 is electrically connected to the printed circuit board 100 via data signal transmission films 300.

A data driving IC 350 is mounted at each data signal transmission film 300 to output picture signals. Furthermore, a plurality of data signal leads 310 are formed at the data signal transmission film 300 to relay the picture signals from the data driving IC 350 to the data lines 62. The data signal leads 310 and the data lines 62 are connected to each other at contact portions C2.

A plurality of gate signal transmission films 400 are mounted at the left side of the substrate 10 while being electrically connected thereto. A gate driving IC 450 is mounted at each gate signal transmission film 400 to output gate signals. A plurality of gate signal leads 410 are formed at the gate signal transmission film 400 to relay the gate signals from the gate driving IC 450 to the gate lines 22. The gate signal leads 410 and the gate lines 22 are connected to each other at contact portions C1.

Gate signal control lines 220 are formed at the outside of the display area D while being connected to gate control signal leads 320 of the data signal transmission film 300 at contact portions C3 and to gate control signal leads 420 at contact portions C4. As in the first preferred embodiment, the signal lines 220 are formed on the substrate 10, and an insulating layer covers the control signal lines 220. Contact holes 270 are formed at the insulating layer while exposing the control signal lines 220 such that the length L of the lateral side of the contact hole 270 bordering on the control signal line 220 is longer than the width W of the contact hole 270. Subsidiary pads are connected to the control signal lines 220 through the contact holes 270.

Such a line structure may be applied also to a common voltage signal unit of the TFT array substrate for transmitting common voltage signals to a common electrode of the color filter substrate. In this case, common voltage pads are formed on the substrate 10, and an insulating layer covers the pads. Contact holes are formed at the insulating layer while exposing the common voltage pads such that the lateral side of each contact hole bordering on the pad has a length longer than the width of the contact hole. Subsidiary pads are connected to the common voltage pads through the contact holes. In the combination of the substrates, the common electrode of the color filter substrate contacts the common voltage pads of the TFT array substrate.

In the above-structured liquid crystal display, the gate control signals output from the printed circuit board 100 are transmitted to the gate control signal lines 220 via the gate control signal leads 320 of the data signal transmission film 300, and input into the gate driving IC 450 via the gate control signal leads 420 of the gate signal transmission film 400.

Upon receipt of the gate control signals, the gate driving IC 400 outputs gate signals to the gate lines 21 through the gate signal lead 410.

In addition to the data signal transmission film 300, a separate signal transmission film may be provided to interconnect the printed circuit board 100 and the substrate 10.

Figure 6:
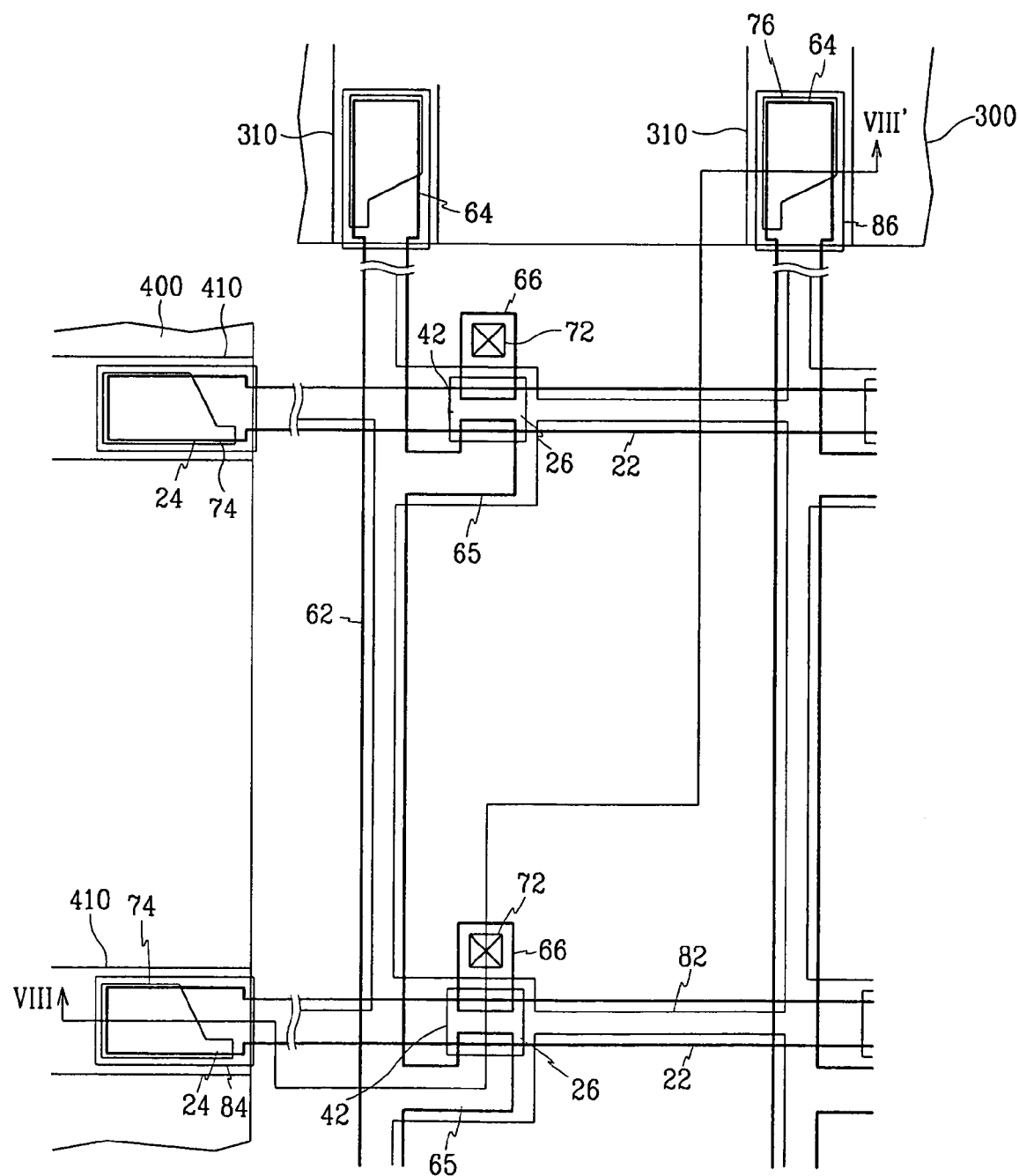
FIG. 6 is a plan view of the liquid crystal display shown in FIG. 5 at a pixel region.
Figure 7:
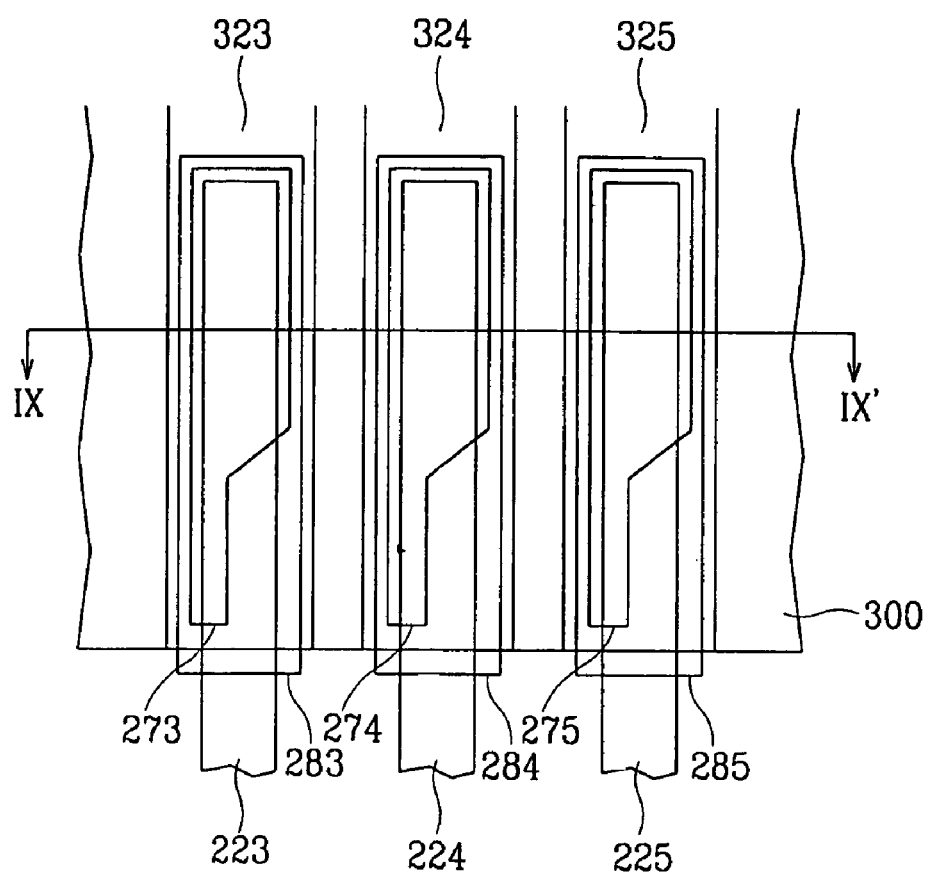
FIG. 7 is a plan view of the control signal unit shown in FIG. 5.
Figure 8:
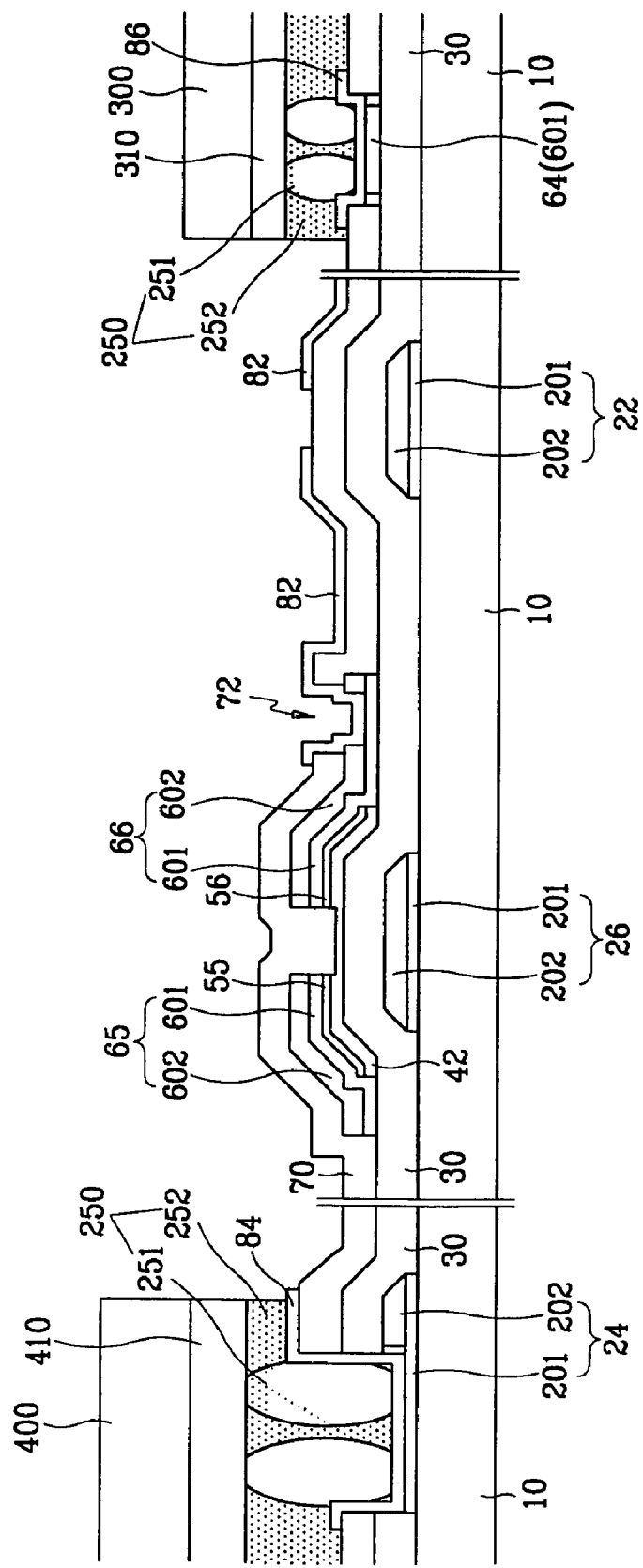
FIG. 8 is a cross sectional view of the liquid crystal display taken along the VIII–VIII' line of FIG. 6.
Figure 9:
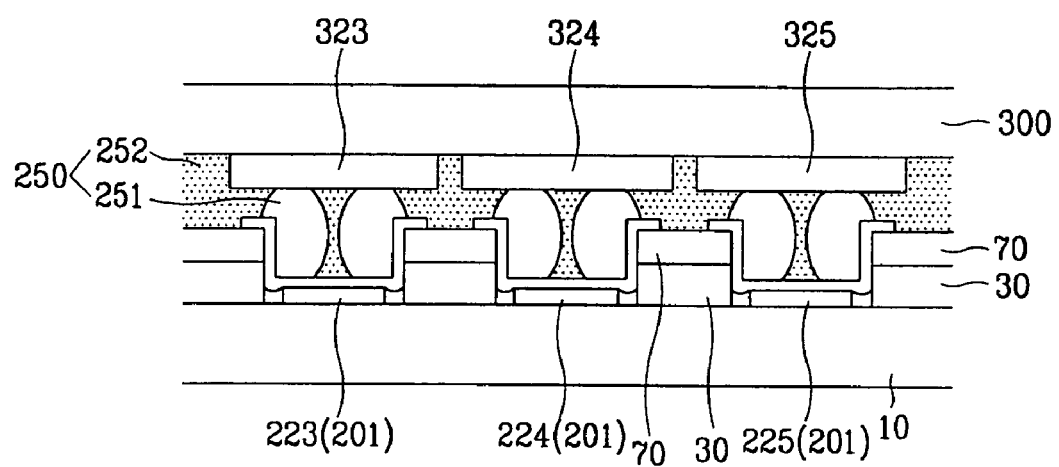
FIG. 9 is a cross sectional view of the liquid crystal display taken along the IX–IX' line of FIG. 7.
Figure 10A:
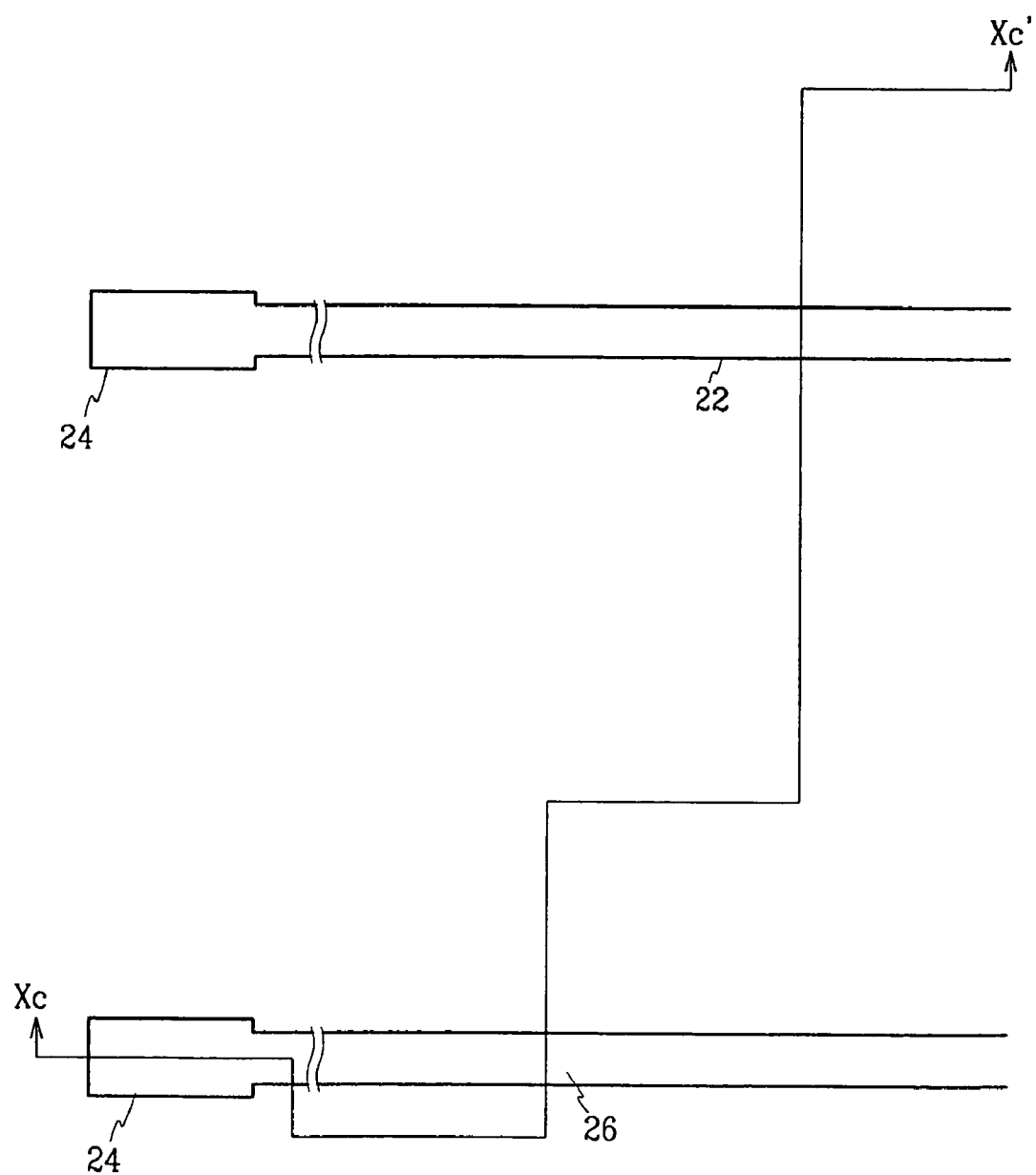
Figure 10B:
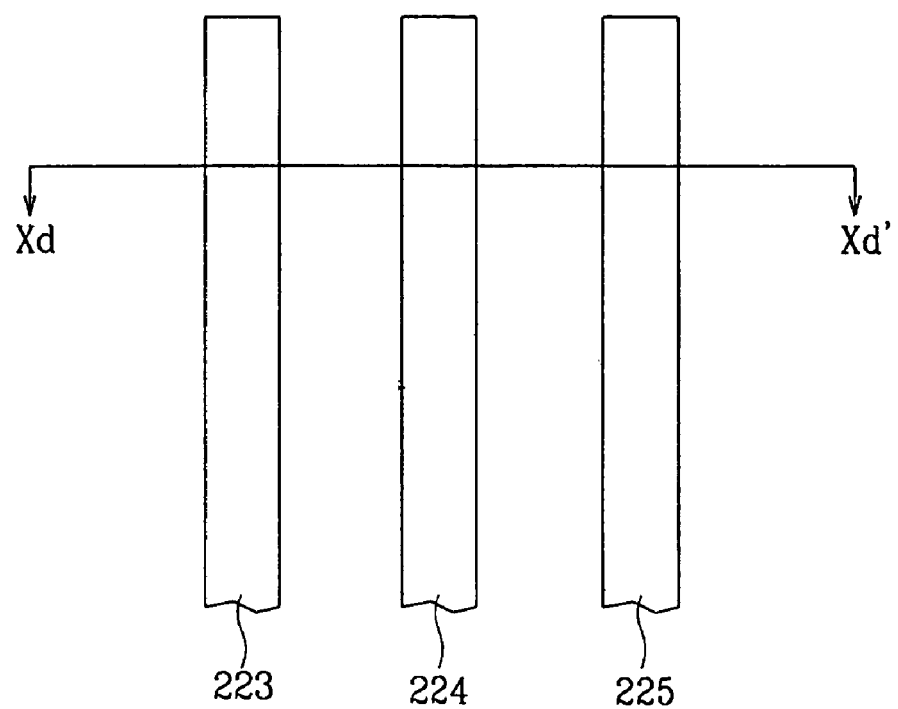
Figure 10D:
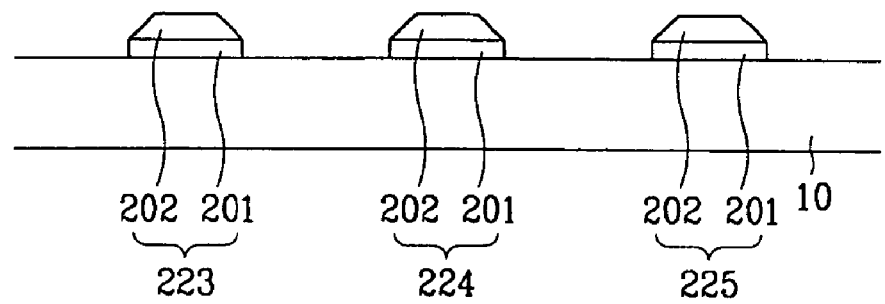
Figure 11A:
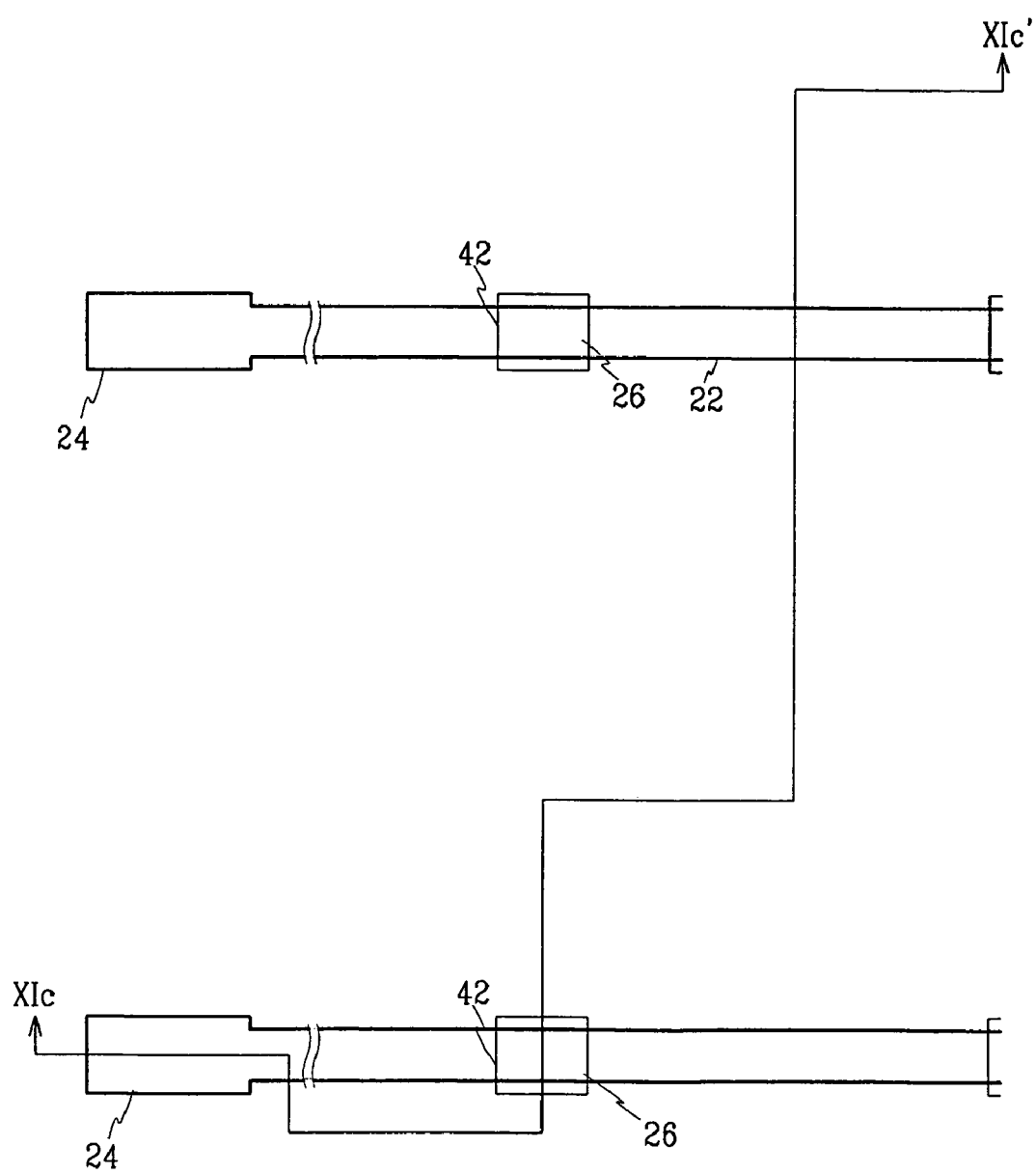
Figure 11B:
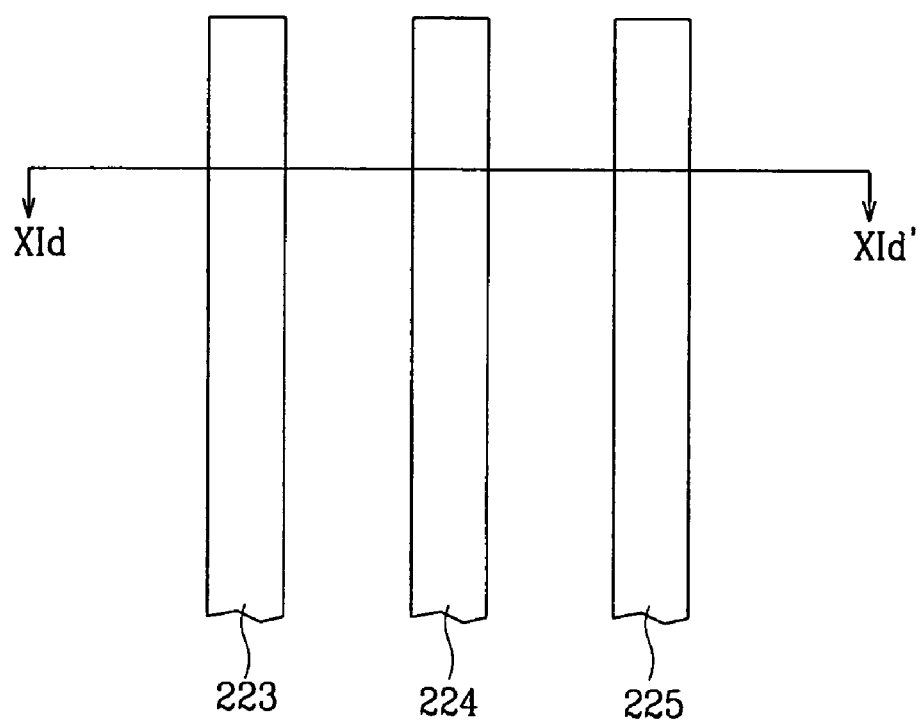
Figure 11C:
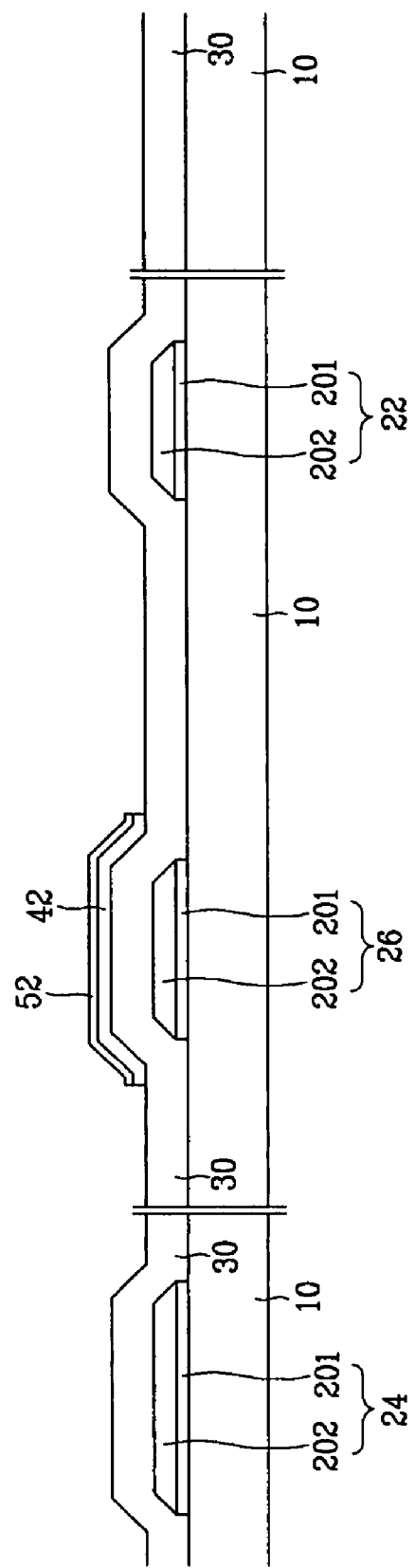
Figure 11D:
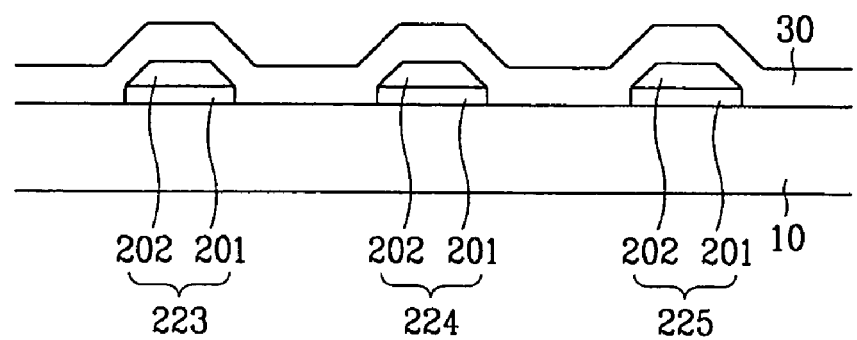
Figure 12A:
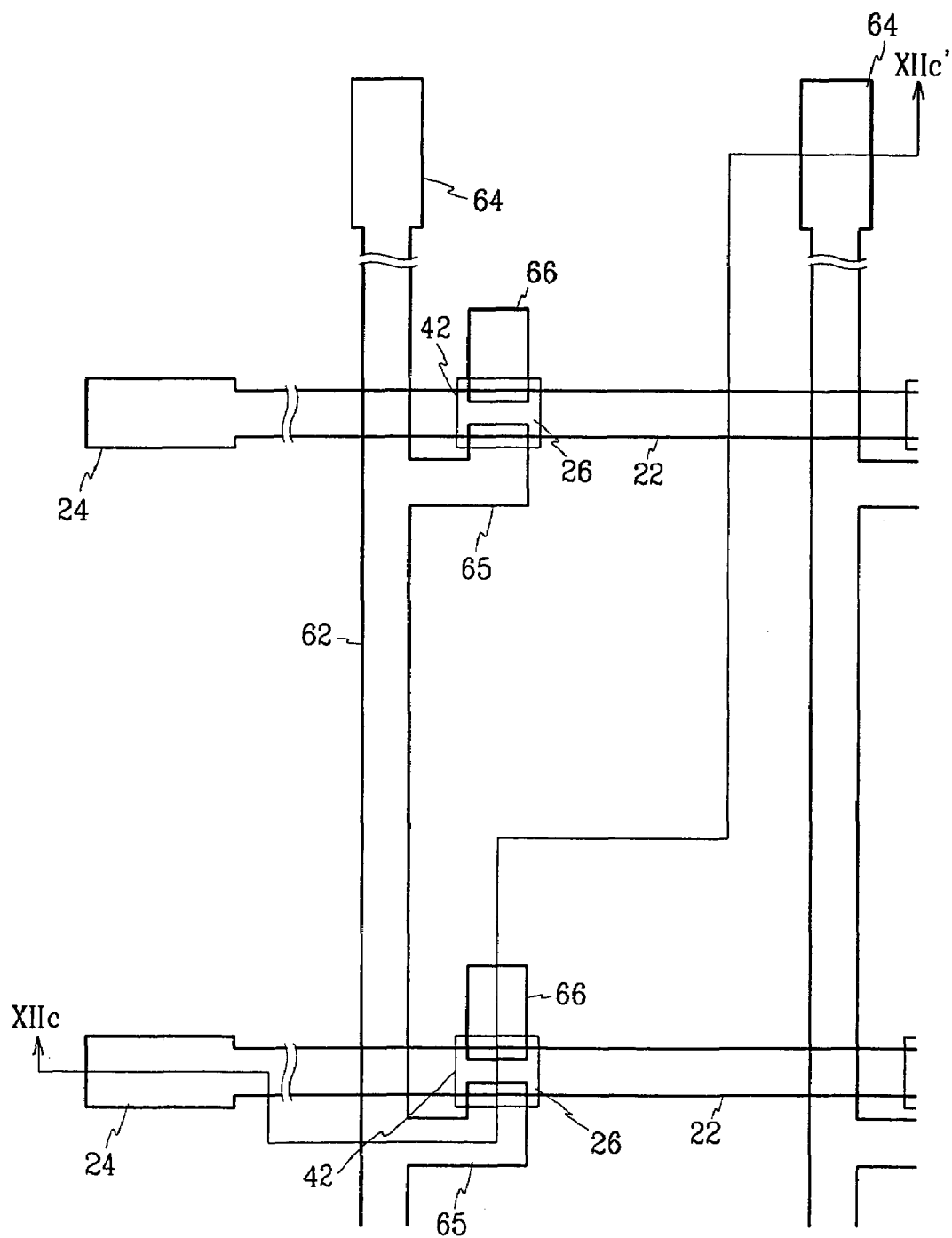
Figure 12B:
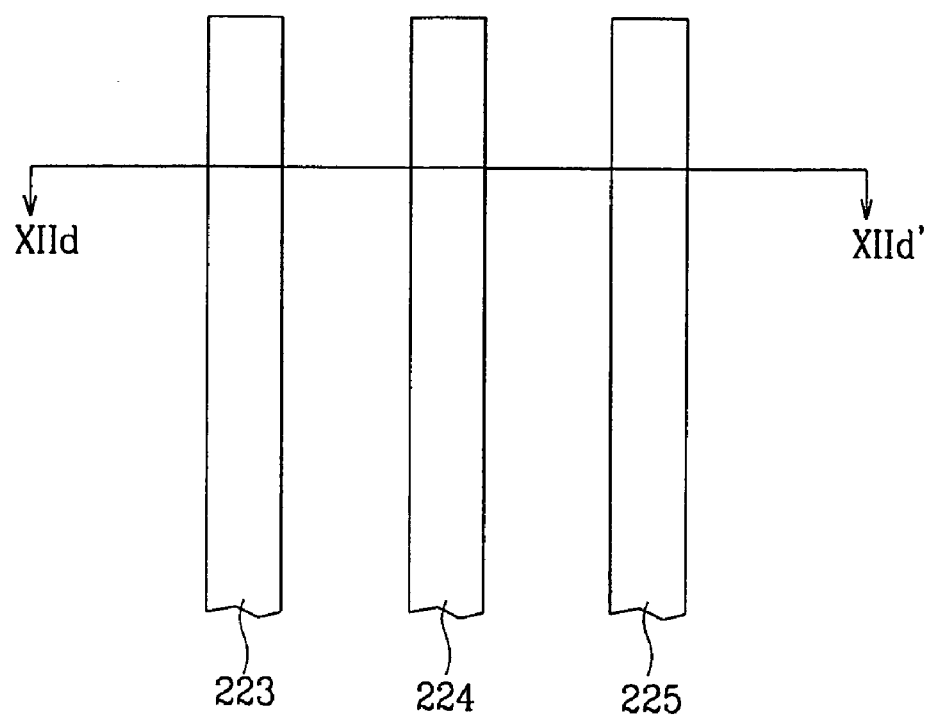
Figure 12C:
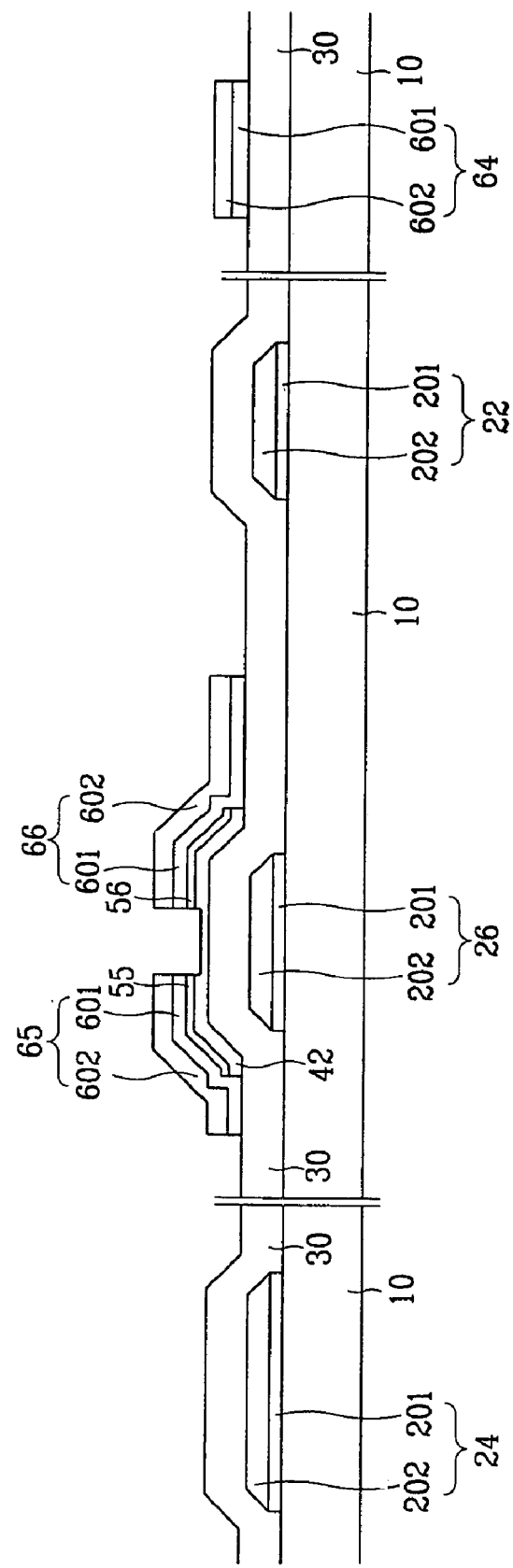
Figure 12D:
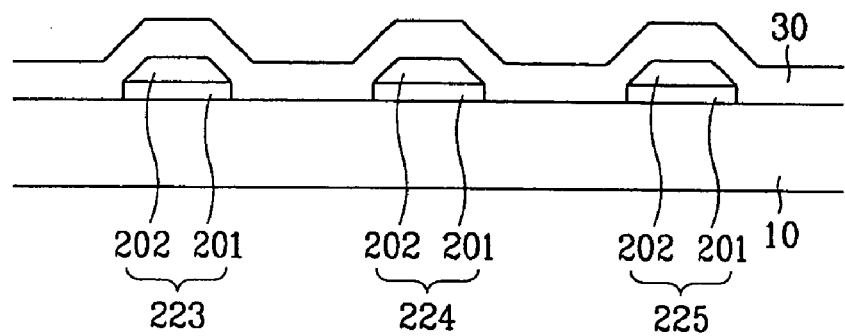
Figure 13A:
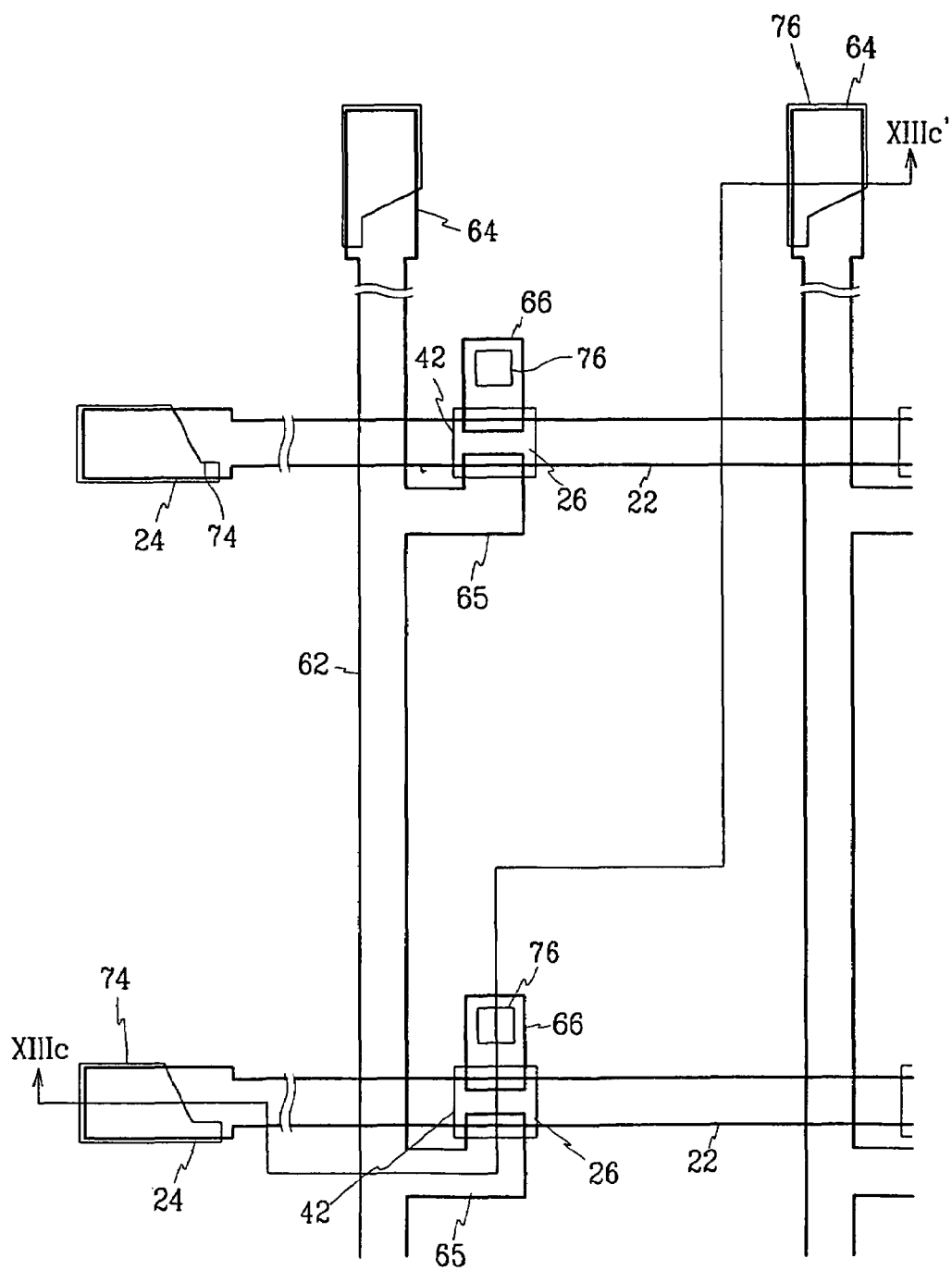
Figure 13B:
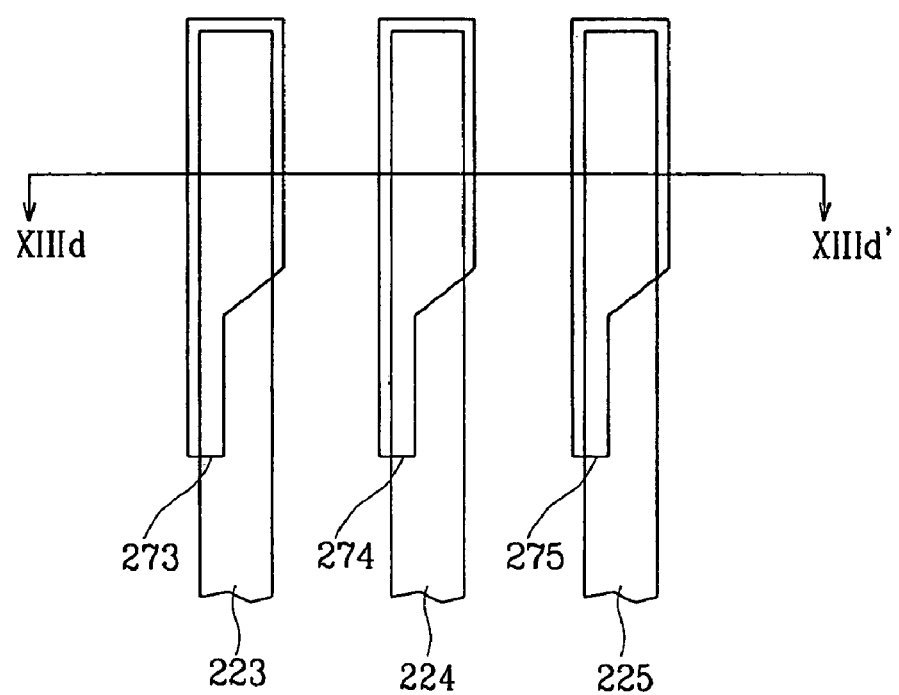
Figure 13C:
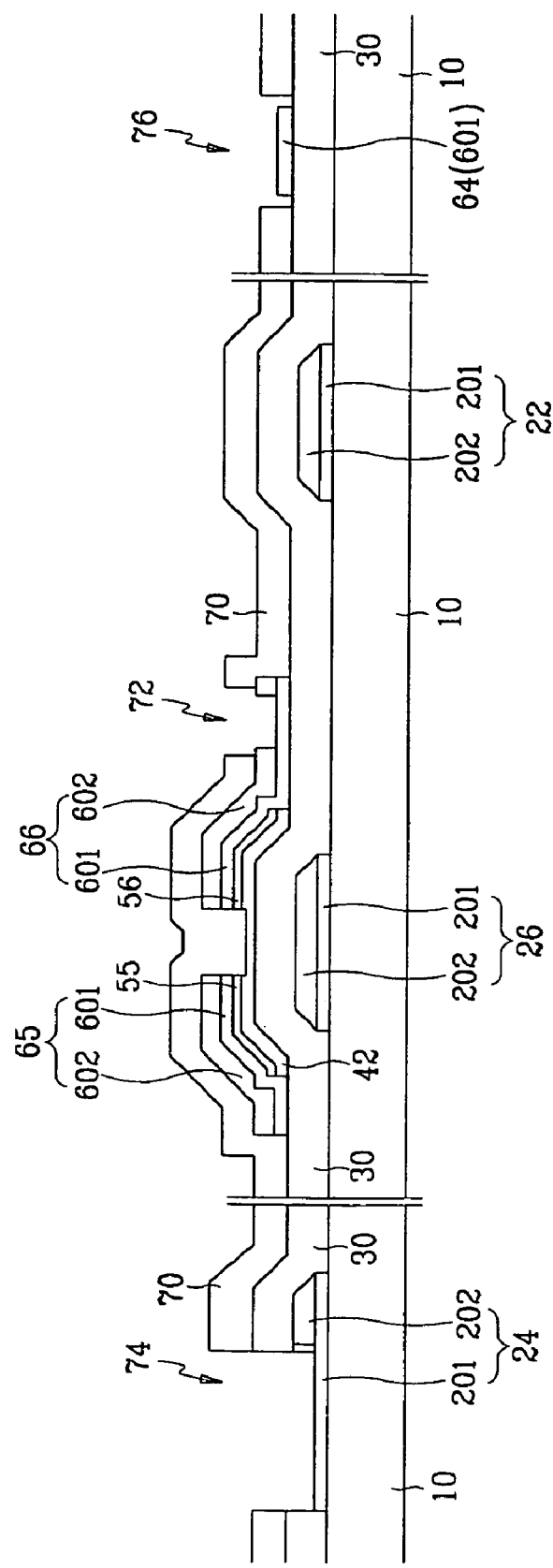
Figure 13D:
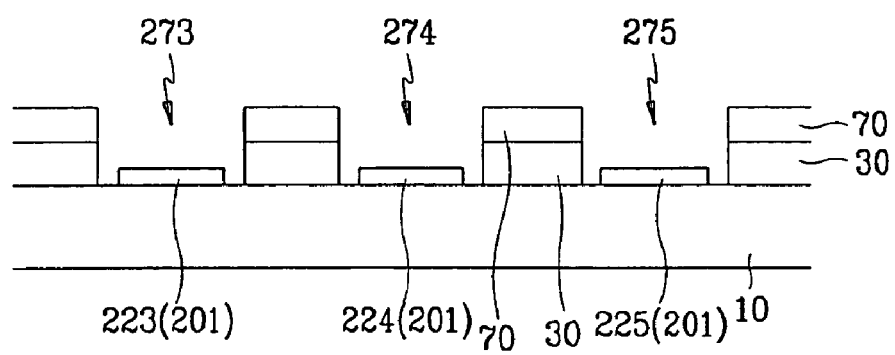
Figure 14A:
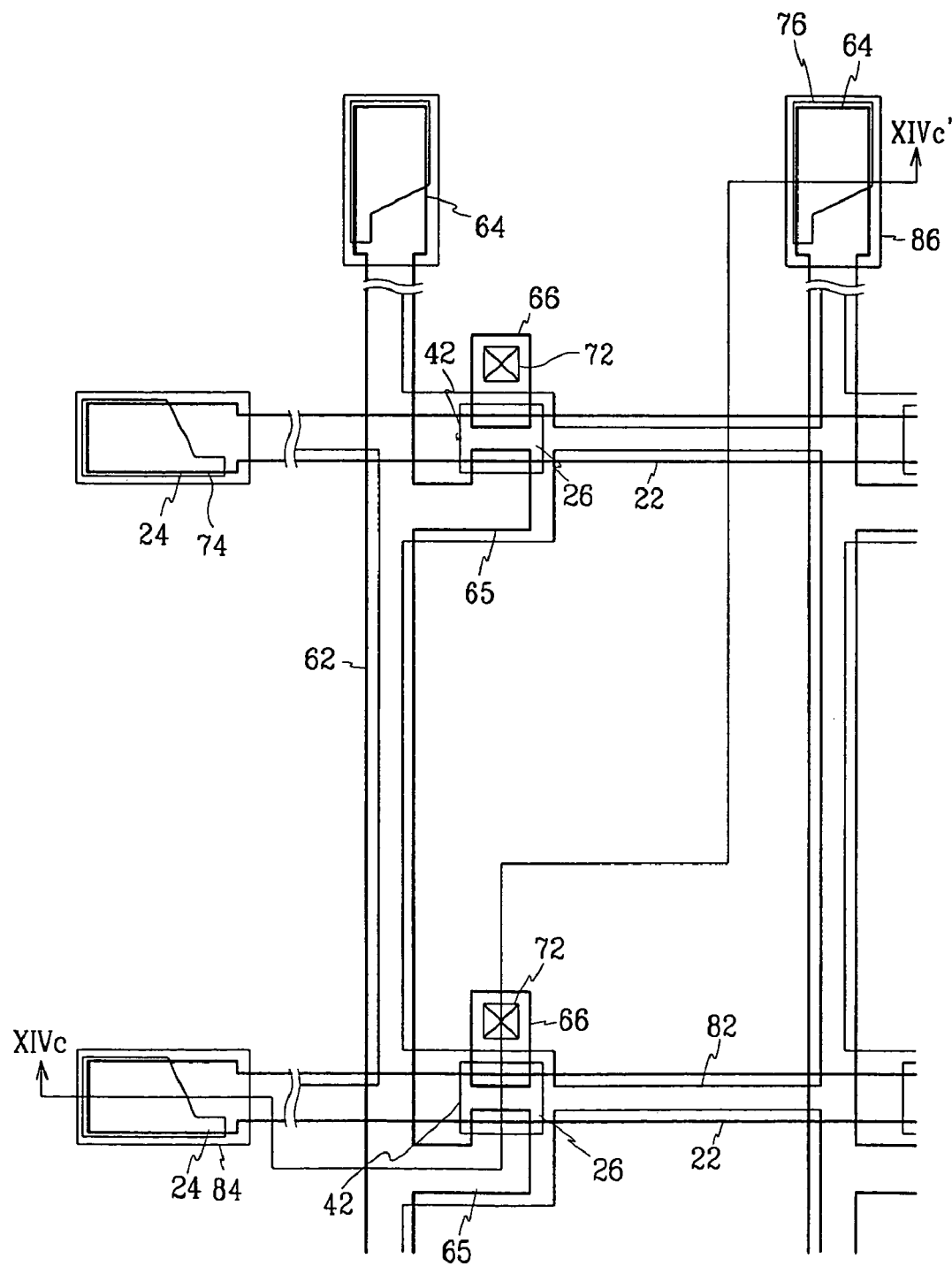
Figure 14B:
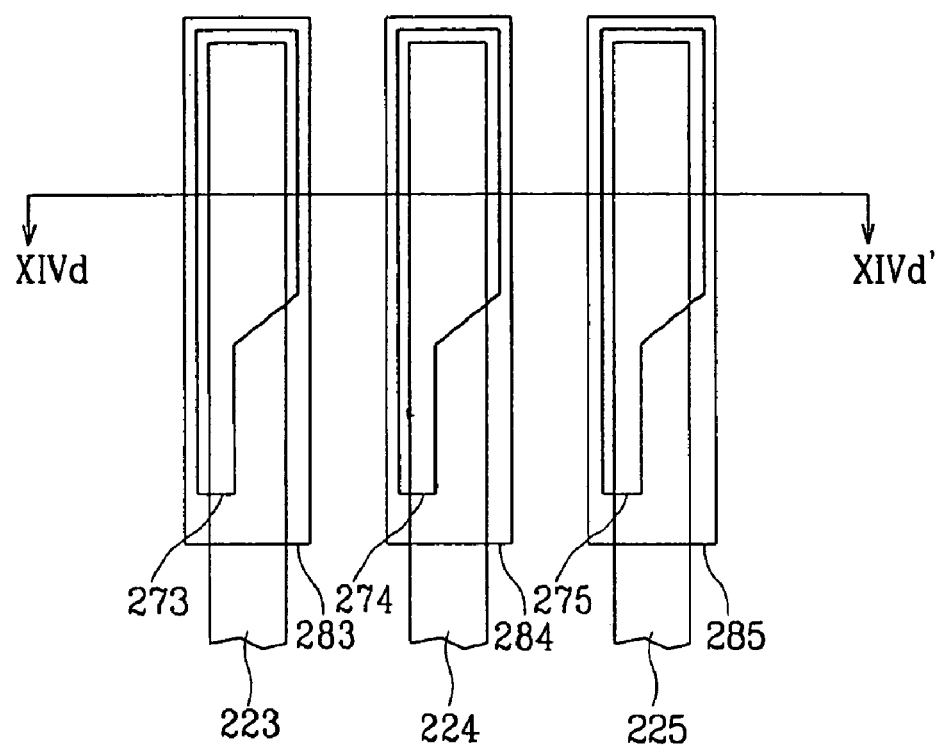
Figure 14C:
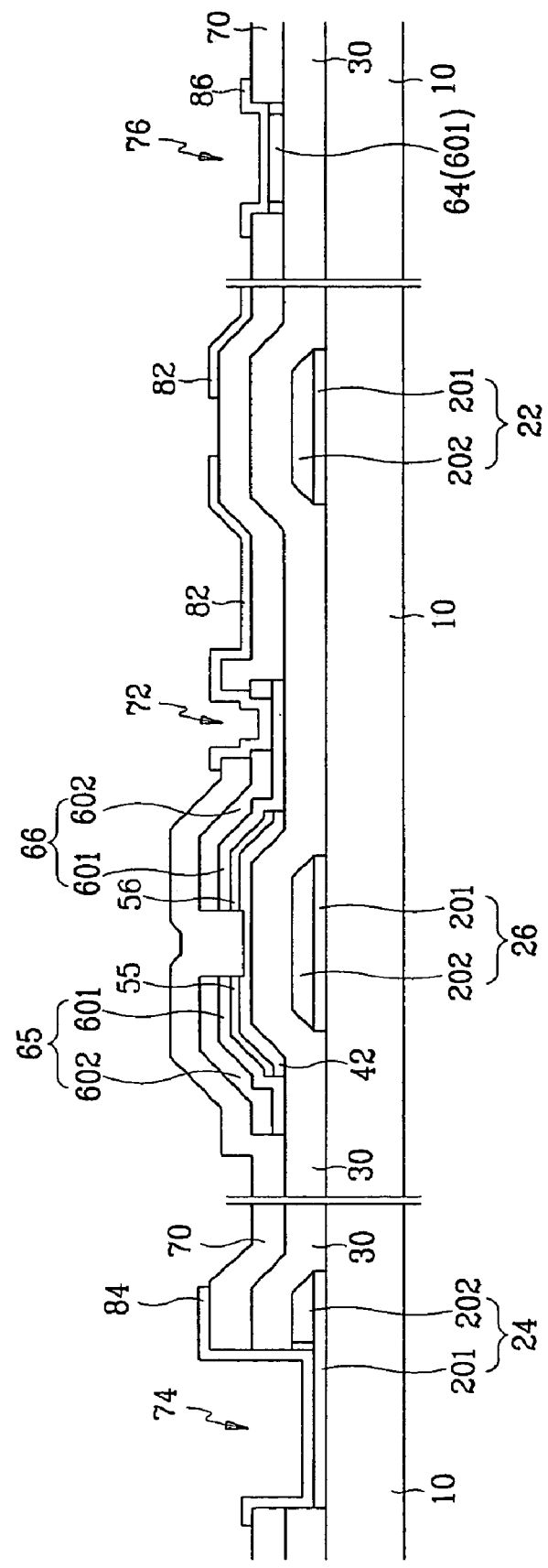
Figure 14D:
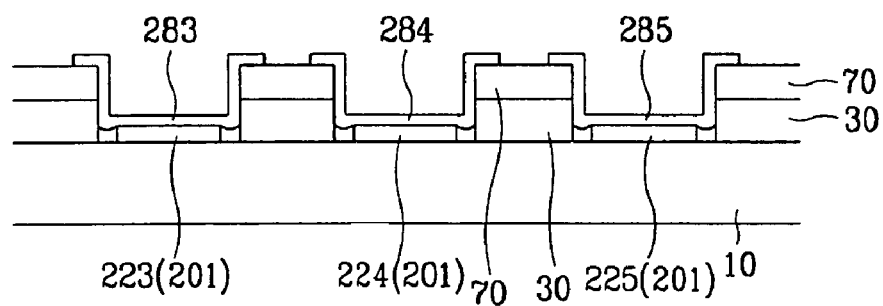

FIG. 6 illustrates the liquid crystal display at a pixel region. FIG. 7 illustrates the control signal unit for the liquid crystal display. FIG. 8 is a cross sectional view of the liquid crystal display taken along the VIII–VIII' line of FIG. 6. FIG. 9 is a cross sectional view of the liquid crystal display taken along the IX–IX' line of FIG. 7. As the structure of the control signal unit at the contact portions C4 is the same as that at the contact portions C3, explanation for the latter structure will be omitted.

A gate line assembly and gate control signal lines 223, 224 and 225 are formed on an insulating substrate 10 with a double-layered structure where an under-layer 201, and an over-layer 202 are present. The under-layer 201 is formed of a metallic material based on chrome or molybdenum while bearing a thickness of 500–1000 Å. The over-layer 202 is formed of a low resistance metallic material based on aluminum while bearing a thickness of 1500–2500 Å. Alternatively, the gate line assembly and the gate control signal lines 223, 224 and 225 may be formed with a single or triple or more layered structure.

The gate line assembly includes gate lines 22 proceeding in the horizontal direction, gate electrodes 26 connected to the gate lines 22, and gate pads 26 connected to the one-sided ends of the gate lines 22 to receive gate signals from the gate signal lead 410 of the gate signal transmission film 400 and send them to the gate lines 22.

The gate control signal leads 223, 224 and 225 proceeds perpendicular to the gate lines 22 at the top of the substrate 10 while proceeding parallel to the gate lines 22 at the left side of the substrate 10. The gate control signal leads 223, 224 and 225 shown in FIG. 7 are positioned at the top of the substrate 10 while being connected to the data signal transmission film 300 at the contact portions C3.

A gate insulating layer 30 covers the gate line assembly and the gate control signal lines 223, 224 and 225. The gate insulating layer 30 is formed of an insulating material such as silicon nitride.

A semiconductor pattern 42 is formed on the gate insulating layer 30 over each gate electrode 26 of amorphous silicon. Ohmic contact patterns 55 and 56 are formed on the semiconductor pattern 42 of impurities-doped amorphous silicon.

A data line assembly is formed on the ohmic contact patterns 55 and 56, and the gate insulating layer 30 with a double-layered structure where an under-layer 601, and an over-layer 602 are present. The under-layer 601 is formed of a metallic material based on molybdenum or chrome, and the over-layer 602 of a metallic material based on aluminum.

The data line assembly includes data lines 62 proceeding in the vertical direction, source electrodes 65 connected to the data lines 62, drain electrodes 66 separated from the source electrodes 65, and data pads 64 connected to the data lines 62 to relay picture signals from the data signal leads 310 of the data signal transmission film 300 to the data lines 62.

The data line assembly may be formed with a single, triple or more layered structure as in the gate line assembly.

The TFT comprises the gate electrode 26, the semiconductor pattern 42, the source electrode 65, and the drain electrode 66.

A protective layer 70 is formed on the data line assembly, the semiconductor patterns 42 and the gate insulating layer 30 of silicon nitride, or organic insulating material.

In the area of pixel regions, contact holes 72 are formed at the protective layer 70 and the aluminum-based over-layer 602 of the drain electrodes 66 while exposing the under-layer 601 of the drain electrodes 66. In the area of contact portions C1, contact holes 74 are formed at the protective layer 70, the gate insulating layer 30 and the aluminum-based over-layer 202 of the gate pads 24 while exposing the under-layer 201 of the gate pads 24. In the area of contact portions C2, contact holes 76 are formed at the protective layer 70 and the aluminum-based over-layer 602 of the data pads 64 while exposing the under-layer 601 of the data pads 64. Furthermore, in the area of contact portions C4, contact holes 273 to 275 are formed at the protective layer 70, the gate insulating layer 30 and the aluminum-based over-layer 202 of the gate control signal lines 223, 224 and 225 while exposing the under-layer 201 of the gate control signal lines 223, 224 and 225.

The contact holes 273 to 275 exposing the gate control signal lines 223 to 225 are roughly outlined along the shape of the gate control signal lines 223 such that the lateral side of each contact hole bordering on the gate control signal line is longer than the width thereof. Furthermore, the contact holes 74 and 76 exposing the gate and data pads 24 and 64 are also outlined along the shape of the gate and data pads 24 and 64 such that the lateral side of each contact hole bordering on the pad has a length longer than the width thereof. Each of the contact holes 74, 76, 273, 274 and 275 has a lateral side bordering on the under-layers 201 and 601 that is partially inclined in the direction of width of the under-layers 201 and 601.

Like the above, when the boundary between the contact holes and the control signal lines is elongated, the boundary between the over-layers 202 and 602 and the under-layers 201 and 601 at the contact holes is also elongated. Consequently, when static electricity is discharged from the over-layers 202 and 602 to the under-layers 201 and 601, voltage drop can be reduced and the amount of Joule heat is decreased, thereby preventing opening of the control signal lines.

It is preferable that the contact hole 72 exposing the drain electrode 66 has a width at the protective layer 70 longer than that at the under-layer 601. In this case, since the upper portion of the contact hole 72 is wider than the lower portion, a pixel electrode 82 can contact the under-layer 601 of the drain electrode 66 through the contact hole 72 in a stable manner. Since the contact hole 76 exposing the data pad 64 is formed together with the contact hole 72 exposing the drain electrode 66, the contact holes 72 and 76 have the same sectional structure.

Pixel electrodes 82, subsidiary gate pads 84, subsidiary data pads 86, and subsidiary gate control signal pads 283, 284 and 285 are formed on the protective layer 70 with a transparent conductive material such as ITO.

The pixel electrode 82 is connected to the drain electrode 66 through the contact hole 72 to receive the picture signals. The subsidiary gate and data pads 84 and 86 are connected to the gate and data pads 24 and 64 through the contact holes 74 and 76 to reinforce adhesion between the pads 24 and 64 and the leads 310 and 410 of the data and gate signal transmission films 300 and 400.

The subsidiary gate control signal pads 283, 284 and 285 are connected to the gate control signal lines 223, 224 and 225 through the contact holes 273, 274 and 275. Likewise, the subsidiary gate control signal pads 283, 284 and 285 reinforce adhesion between the gate control signal lines 223, 224 and 225 and the gate control signal leads 323, 324 and 325.

Meanwhile, the data and gate signal transmission films 300 and 400 are attached to the TFT array substrate 10 using an anisotropic conductive film 250 with conductive particles 251 and adhesives 252.

The gate signal leads 410 of the gate signal transmission film 400 are electrically connected to the subsidiary gate pads 84 via the conductive particles 251 of the anisotropic conductive film 250 at the contact portions C1. Furthermore, the data signal leads 310 of the data signal transmission film 300 are electrically connected to the subsidiary data pads 86 via the conductive particles 251 of the anisotropic conductive film 250 at the contact portions C2. The data signal transmission film 300 is also provided with gate control signal leads 323, 324 and 325. The gate control signal leads 323, 324 and 325 are electrically connected to the gate control signal lines 223, 224 and 225 via the conductive particles 251 of the anisotropic conductive film 250 at the contact portions C3.

For instance, the gate control signal lead 323 carries gate on voltage Von of about 20V, the gate control signal lead 324 carries gate off voltage Voff of 0V or less, and the gate control signal lead 325 carries common voltage Vcom of about 7V. The gate control signal leads 323, 324 and 325 are electrically connected to the gate control signal lines 223, 224 and 225 to transmit gate control signals thereto.

The gate on voltage Von, the gate off voltage Voff, and the common voltage Vcom are transmitted to the signal lines 223, 224 and 225 via the signal leads 323, 324 and 325. In this case potential difference is made between the signal line 223 carrying the gate on voltage and the signal line 224 carrying the gate off voltage. Furthermore, potential difference is also made between the signal line 224 carrying the gate off voltage and the signal line 225 carrying the common voltage. Likewise, potential difference is made between other signal lines not illustrated in the drawing.

Such a potential difference induces the phenomenon where negative ion particles in the moisture content intruded into the control signal unit during the operation electrochemically react with the signal lines 223, 224 and 225, and melt them.

In this connection, a thick dummy lead is formed between the high voltage signal line 223 carrying the gate on voltage and the low voltage signal line 224 carrying the gate off voltage. That is, a dummy lead of several to several tens micrometers is formed on the signal transmission film while being positioned between the high and low voltage signal lines 223 and 224 of several hundreds to several thousands angstroms.

When the data transmission film 300 and the substrate 10 are thermally compressed, and attached to each other via the anisotropic conductive film 500, the adhesives 252 of the anisotropic conductive film 250 is compressed against the thick dummy lead while becoming so compact in structure as to obstruct the flowing of the negative ion particles. Therefore, the dummy lead functions as a barrier intercepting the flowing of the negative ions.

In this case, even though the moisture content is introduced into the control signal unit, the thick dummy lead prevents the negative ion particles of the moisture content from intruding into the high voltage signal line 223.

When the voltage equivalent to the gate on voltage to be applied to the high voltage signal line 223 is applied to the dummy lead, equi-potential is formed between the high voltage signal line 223 and the dummy lead. In this case, even though negative ion particles intrude into the high voltage signal line 223, equi-potential is formed around the high voltage signal line 223 so that the negative ion particles float about the high voltage signal line 223.

Accordingly, the high voltage signal line does not react with the negative ion particles so that it does not suffer damage due to the negative ion particles.

When a dummy line electrically connected to the dummy lead of the data signal transmission film 300 is formed between the high voltage signal line 223 and the low voltage signal line 224, large and stable equi-potential can be formed around the high voltage signal line 223.

The signal line of the control signal unit may be formed with a common metallic material such as the conductive material for the gate or data line assembly. Furthermore, the signal line of the control signal unit may be formed of a less oxidative conductive material based on copper, silver, chrome, molybdenum, chrome nitride, or molybdenum nitride. Such a conductive material little influences electrolysis. Furthermore, in case the dummy line is formed with an oxidized conductive material such as ITO and IZO, reaction due to the negative ion particles can be reduced.

Meanwhile, the leads 310, 410, 323, 324 and 325 of the data and gate signal transmission films 300 and 400 wholly cover the contact holes 74, 76, 273, 274 and 275 in the longitudinal direction while covering only one side of the contact holes 74, 76, 273, 274 and 275 in the direction of width.

In this structure, the anisotropic conductive film 500, or the leads 310, 410, 323, 324 and 325 of the data and gate signal transmission films 300 and 400 cover the substrate pads or the contact holes 74, 76, 273, 274 and 275 over the lines 84, 86, 283, 284 and 285 in order to prevent possible erosion at the contact portions C1, C2, C3 and C4. This can reinforce adhesion at those portions, obtaining good contact characteristics.

A method for fabricating the liquid crystal display will be now explained with reference to FIGS. 10A to 14D.

As shown in FIGS. 10A to 10D, a metallic under-layer 201 is deposited onto a substrate 10, and an aluminum-based over-layer 202 is deposited onto the under-layer 201. The over-layer 202 and the under-layer 201 are etched to thereby form a gate line assembly and gate control signal lines 223, 224 and 225 that have a double-layered structure. The gate line assembly includes gate lines 22, gate pads 24, and gate electrodes 26.

Thereafter, as shown in FIGS. 11A to 11D, a gate insulating layer 30, a semiconductor layer, and an impurities-doped semiconductor layer are sequentially deposited onto the substrate 10. The impurities-doped semiconductor layer and the semiconductor layer are etched through photolithography to thereby form island-shaped semiconductor patterns 42 and island-shaped ohmic contact patterns 52.

As shown in FIGS. 12A to 12D, a metallic under-layer 601 is deposited onto the substrate 10, and an aluminum-based over-layer 602 is deposited onto the metallic under-layer 601. The over-layer 602 and the under-layer 601 are etched through photolithography to thereby form a data line assembly. The data line assembly includes data lines 62, data pads 64, source electrodes 65, and drain electrodes 66.

The island-shaped ohmic contact patterns 52 are etched through the source electrodes 65 and the drain electrodes 66, and separated into first ohmic contact patterns 55 contacting the source electrodes 65 and second ohmic contact patterns 56 contacting the drain electrodes 66.

As shown in FIGS. 13A to 13D, an insulating material such as silicon nitride and organic insulating material is deposited onto the data line assembly to thereby form a protective layer 70.

The protective layer 70 and the gate insulating layer 30 are dry-etched through photolithography to thereby expose the aluminum-based over-layer 202 and 602 of the drain electrodes 66, the gate pads 24, the data pads 74, and the gate control signal lines 223, 224 and 225. The exposed portions of the aluminum-based over-layer 202 and 602 are removed using an aluminum etching solution.

In this way, the contact holes 74, 273, 274 and 275 exposing the chrome-based under-layers 201 and 601 of the gate pads 24 and the gate control signal lines 223, 224 and 225 are completed.

Thereafter, the protective layer 70 over the drain electrodes 66 and the data pads 64 is side-etched such that the aluminum-based layer 602 thereof is exposed to the outside while making the contact holes 72 and 76 to be stepped. In this structure, a pixel electrode 82 contacts the drain electrode 66 through the contact hole 72 in a stable manner. At this time, the contact hole 72 has a top opening width larger than the bottom opening width.

The contact holes 273, 274 and 275 exposing the signal lines 223, 224 and 225 are longitudinally formed along the shape of the signal lines 223, 224 and 225 such that the lateral side of each contact hole bordering on the gate control signal line has a length longer than the width thereof.

Thereafter, as shown in FIGS. 14A to 14D, a transparent conductive material such as ITO is deposited onto the substrate 10, and etched through photolithography to thereby form pixel electrodes 82 connected to the drain electrodes 66, subsidiary gate pads 84 connected to the gate pads 24, subsidiary data pads 86 connected to the data pads 64, and subsidiary gate control signal pads 283, 284 and 285 connected to the gate control signal lines 223, 224 and 225. The pixel electrodes 82, and the subsidiary pads 84, 86, 283 and 284 directly contact the chrome-based under-layer 201 and 601.

After the TFT array substrate is completed, as shown in FIGS. 6 to 9, data signal transmission films 300 and gate signal transmission films 400 are attached to the TFT array substrate using an anisotropic conductive film 500.

At this time, the subsidiary gate pads 84, the subsidiary data pads 86, and the gate control signal lines 223, 224 and 225 are electrically connected to the gate and data signal leads 410 and 310 of the gate and data signal transmission films 400 and 300, and the gate control signal leads 323, 324 and 325 in one to one correspondence.

Figure 15:
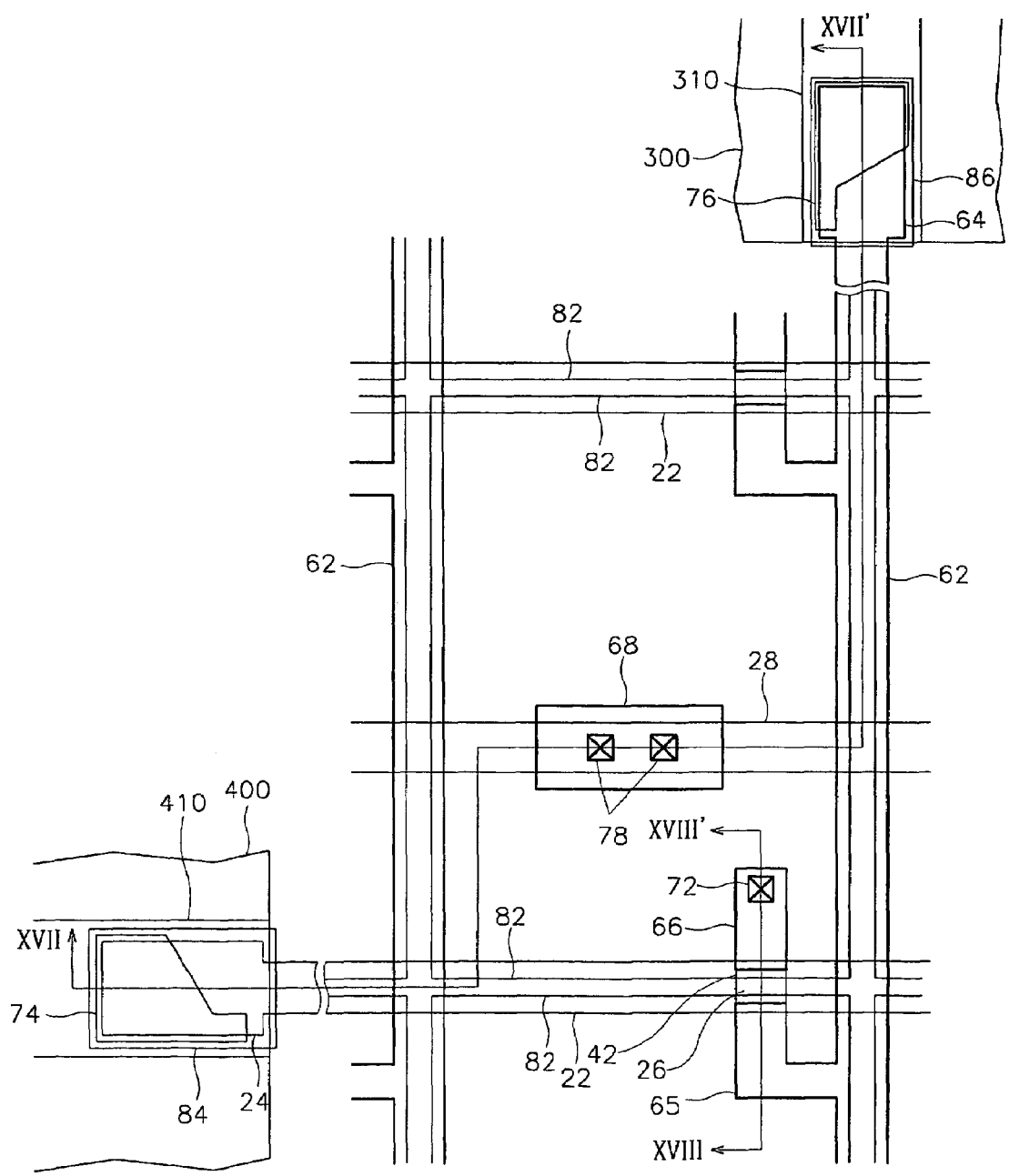
FIG. 15 is a plan view of a liquid crystal display at a pixel region according to a third preferred embodiment of the present invention.
Figure 16:
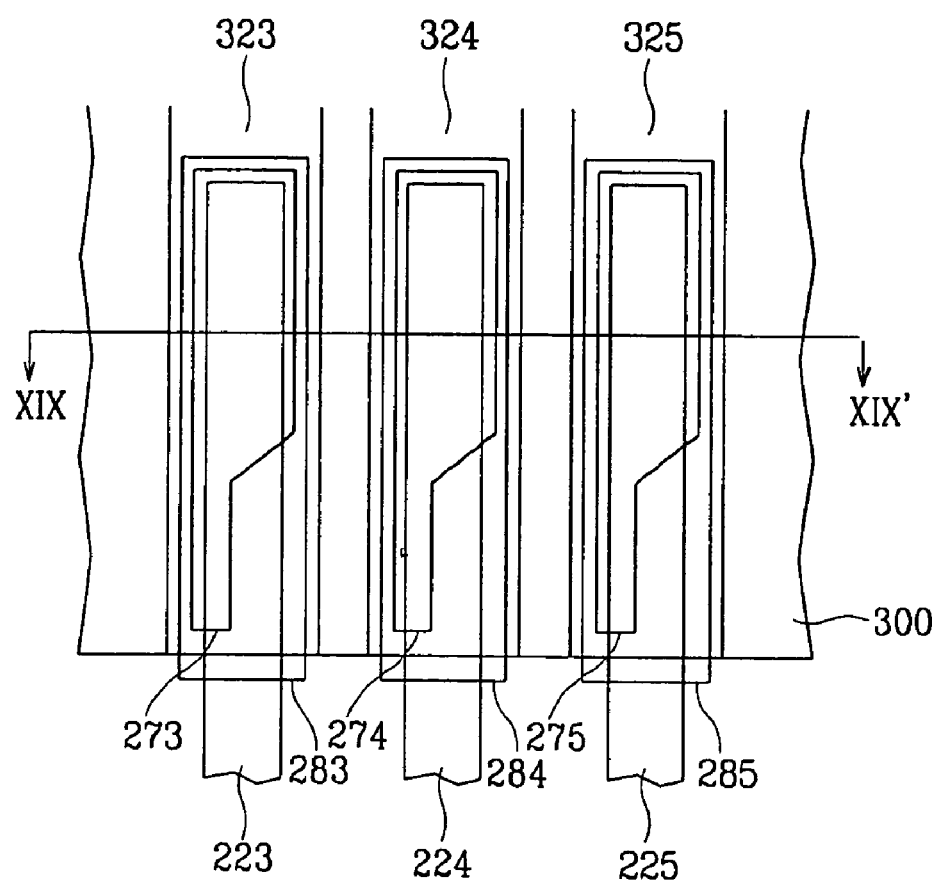
FIG. 16 is a plan view of a control signal unit for the liquid crystal display shown in FIG. 15.

FIG. 15 illustrates a liquid crystal display at a pixel region according to a third preferred embodiment of the present invention, and FIG. 16 illustrates a control signal unit for the liquid crystal display.

Figure 19:
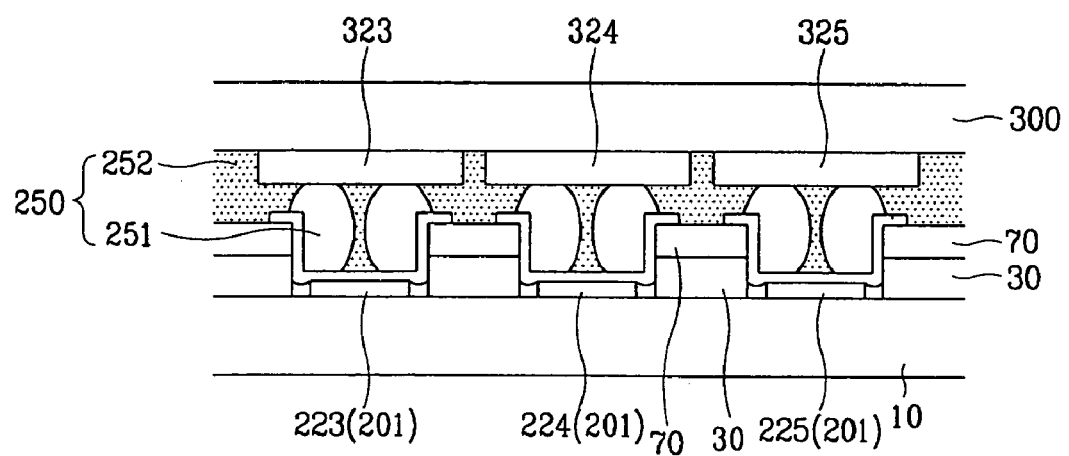
FIG. 19 is a cross sectional view of the control unit taken along the XIX–XIX' line of FIG. 16.
Figure 20B:
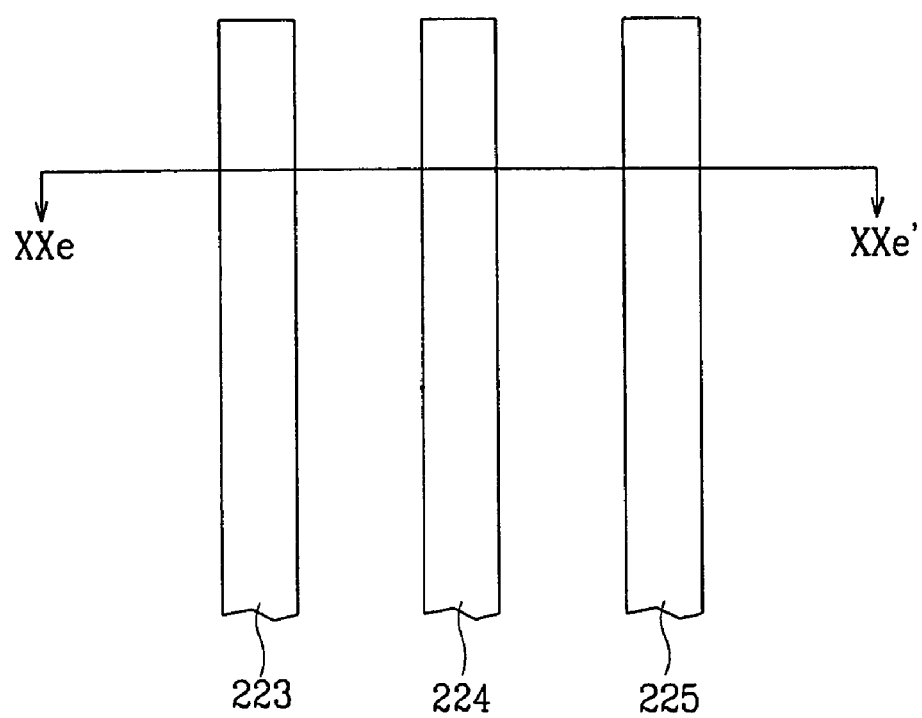
Figure 20E:
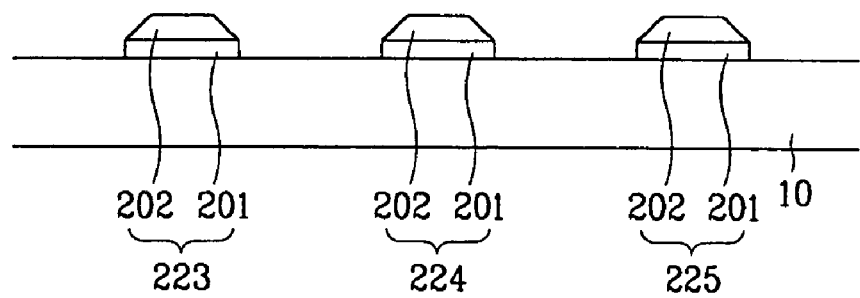
Figure 21A:
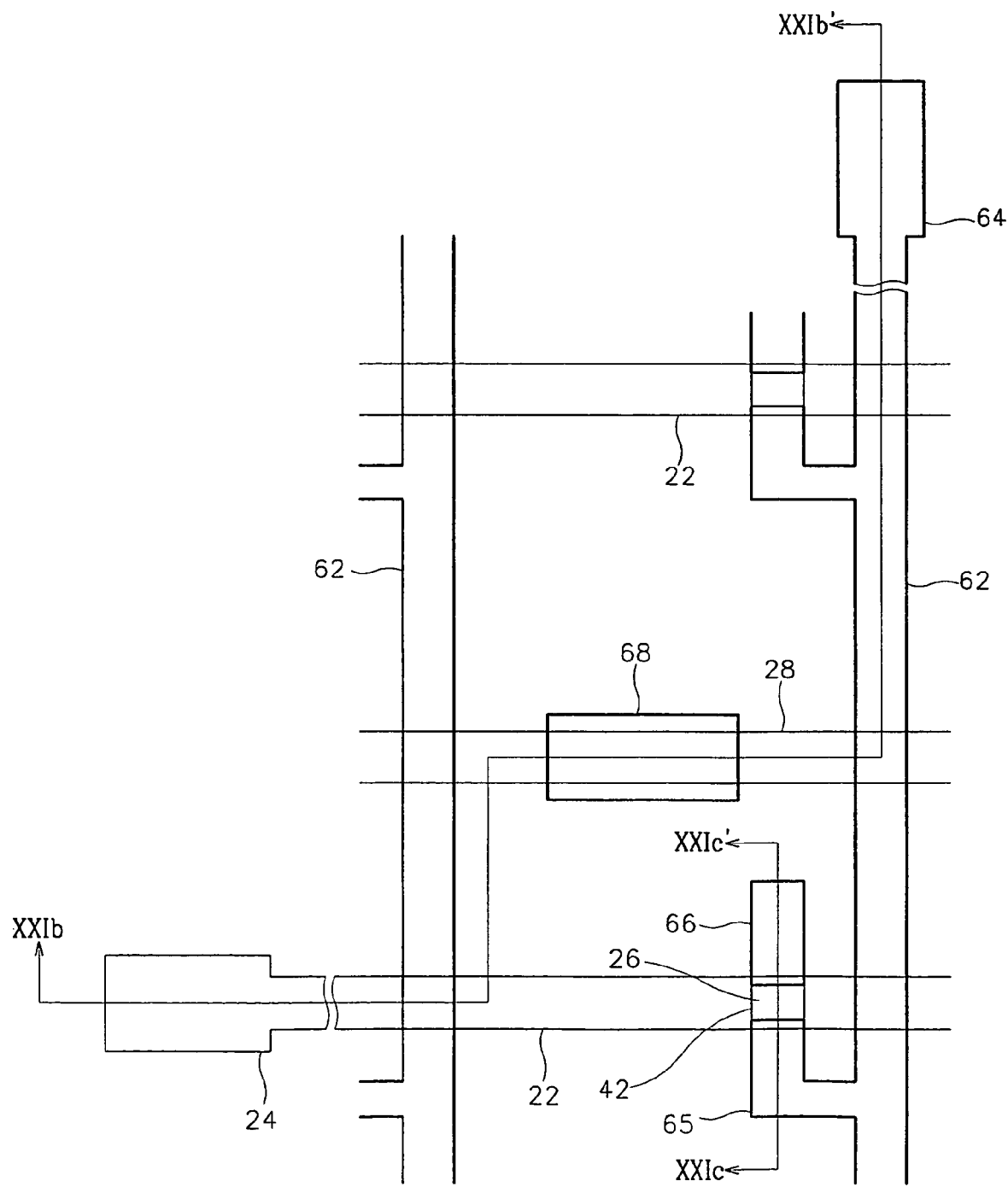
Figure 21B:
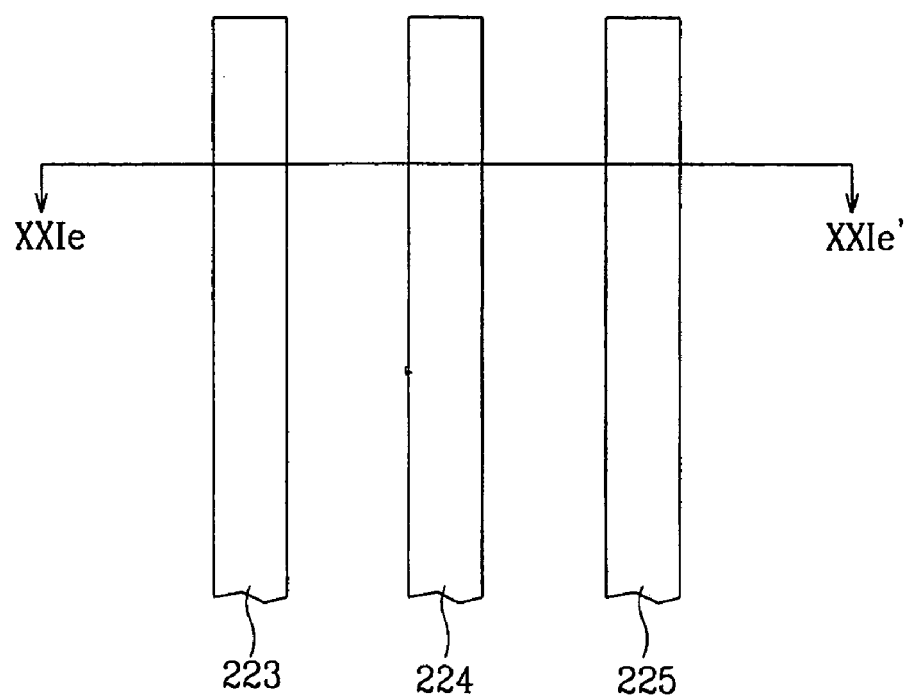
Figure 21E:
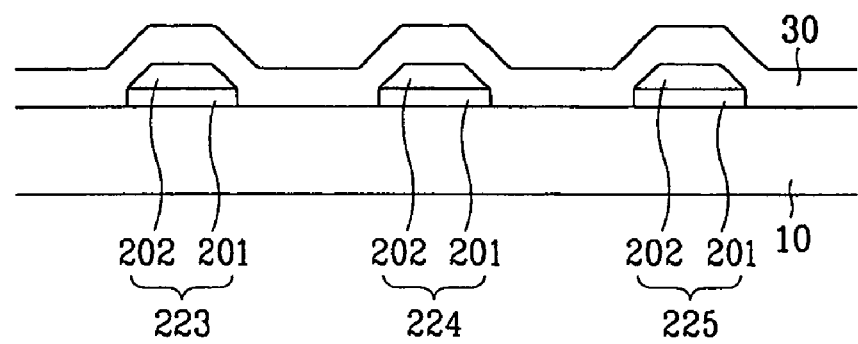

FIG. 17 is a cross sectional view of the liquid crystal display taken along the XVII–XVII' line of FIG. 15, FIG. 18 is a cross sectional view of the liquid crystal display taken along the XVIII–XVIII' line of FIG. 15, and FIG. 19 is a cross sectional view of the control unit taken along the XIX–XIX' line of FIG. 16. As the structure of the control signal unit at the contact portions C4 is the same as that at the contact portions C3, explanation for the latter structure will be omitted.

A metallic under-layer 201 is deposited onto an insulating substrate 10 with a conductive material based on chrome or molybdenum while bearing a thickness of 500–1000 Å, and a metallic over-layer 202 is deposited onto the under-layer 201 with a low resistance material based on aluminum while bearing a thickness of 1500–2500 Å. In this way, a double-layered gate line assembly, and double-layered gate control signal lines 223, 224 and 225 are formed on the substrate 10. Alternatively, the gate line assembly and the gate control signal lines may be formed with a single or triple or more layered structure.

The gate line assembly includes gate lines 22, gate pads 24, gate electrodes 26, and storage capacitor electrodes 28 proceeding parallel to the gate lines 22 to receive common voltages from the outside.

The storage capacitor electrodes 28 are overlapped with storage capacitor conductive patterns 68 connected to pixel electrodes 82 to form storage capacitors for enhancing the storage capacity of each pixel. In case the overlapping of the pixel electrodes 82 and the gate lines 22 gives sufficient storage capacity, the storage capacitor electrodes 28 may be omitted.

The gate control signal lines 223, 224 and 225 proceed perpendicular to the gate lines 22 at the top of the substrate 10 while being extended parallel to the gate lines at the left side of the substrate 10.

A silicon nitride-based gate insulating layer 30 is formed at the substrate 10 with a thickness of 2500–4000 Å while covering the gate line assembly, and the gate control signal lines 223, 224 and 225.

Semiconductor patterns 42 and 48 are formed on the gate insulating layer 30 with amorphous silicon while bearing a thickness of 800–1500 Å. Ohmic contact patterns 55, 56 and 58 are formed on the semiconductor patterns 42 and 48 with impurities-doped amorphous silicon while bearing a thickness of 500–800 Å.

The semiconductor patterns are divided into the TFT semiconductor patterns 42 and the storage capacitor semiconductor patterns 48, and have the same shape as the data line assembly and the ohmic contact patterns 55, 56 and 58 except the TFT channel portions between the source electrodes 65 and the drain electrodes 66. That is, the storage capacitor semiconductor patterns 48 have the same shape as the storage capacitor conductive patterns 68 and the storage capacitor ohmic contact patterns 58. The TFT semiconductor patterns 42 has the same shape as the data line assembly except that they further include the TFT channel portions between the source and the drain electrodes 65 and 66.

A data line assembly is formed on the ohmic contact patterns 55, 56 and 58. The data line assembly has a double-layered structure where a metallic under-layer 601 and a metallic over-layer 602 are present. The under-layer 601 is formed with a conductive material based on chrome or molybdenum while bearing a thickness of 500–1000 Å, and the over-layer 602 is formed with a low resistance material based on aluminum while bearing a thickness of 1500–2500 Å. As with the gate line assembly, the data line assembly may have a single or triple or more layered structure.

The data line assembly includes data lines 62 proceeding in the horizontal direction, data pads 64, source and drain electrodes 65 and 66, and storage capacitor conductive patterns 68 placed over the storage capacitor electrodes 28.

The ohmic contact patterns 55, 56 and 58 lower the contact resistance between the underlying semiconductor patterns 42 and 48 and the overlying data line assembly while bearing the same shape as the data line assembly. One of the ohmic contact patterns 55 contacts the data line 62, the data pad 64 and the source electrode 65 being in a body, another ohmic contact pattern 56 contacts the drain electrode 66, and still another ohmic contact pattern 58 contacts the storage capacitor conductive pattern 68.

A protective layer 70 is formed at the substrate 10 while covering the data line assembly.

In the pixel regions, contact holes 72 and 78 are formed at the protective layer 70, and the aluminum-based layer 602 of the drain electrodes 66 and the storage capacitor conductive patterns 68 while exposing the under-layer 601 of the drain electrodes 66 and the storage capacitor conductive patterns 68. In the contact portions C1, contact holes 74 are formed at the protective layer 70, and the aluminum-based layer 202 of the gate insulating layer 30 and the gate pads 24 while exposing the under-layer 201 of the gate pads 24. In the contact portions C2, contact holes 76 are formed at the protective layer 70 and the aluminum-based layer 602 of the data pads 64 while exposing the under-layer 601 of the data pads 64. In the contact portions C4, contact holes 273, 274 and 275 are formed at the protective layer 70, the gate insulating layer 30 and the aluminum-based layer 202 of the gate control signal lines 223, 224 and 225 while exposing the under-layer 201 of the gate control signal lines 223, 224 and 225, respectively.

The contact holes 273, 274 and 275 exposing the gate control signal lines 223, 224 and 225 are outlined along the shape of the signal lines 223, 224 and 225 such that the lateral side of each contact hole bordering on the gate control signal line has a length greater than the width thereof. Furthermore, the contact holes 74 and 76 exposing the gate pads 24 and the data pads 64 are also outlined along the shape of the gate pads 24 and the data pads 64 such that the lateral side of each contact hole bordering on the pad has a length longer than the width thereof. Each of the contact holes 74, 76, 273, 274 and 275 has a lateral side bordering on the under-layers 201 and 601 that is partially inclined in the direction of width of the under-layers 201 and 601.

Since the boundary between the contact holes and the relevant lines 24, 64, 223, 224 and 225 is elongated, the boundary between the aluminum-based over-layers 202 and 602 and the under-layers 201 and 601 is extended in a longitudinal direction. Therefore, the voltage drop occurred when the static electricity is discharged from the over-layers 202 and 602 to the under-layers 201 and 601 can be reduced, and accordingly, decreasing the amount of Joule heat, which in turn prevents opening of the lines.

The contact holes 74 and 76 exposing the gate and the data pads 24 and 64 are formed along the shape of the gate and data pads 24 and 64 such that the lateral side of each contact hole bordering on the pad has a length longer than the width thereof. Each of the contact holes 74 and 76 has a lateral side bordering on the under-layers 201 and 601 that is partially inclined in the direction of width of the under-layers 201 and 601.

It is preferable that the contact holes 72 and 78 exposing the drain electrodes 66 and the storage capacitor conductive patterns 68 have a width at the protective layer 70 longer than that at the under-layer 601. Since the top opening width of the contact holes 72 and 78 is longer than the bottom opening width thereof, pixel electrodes 82 can contact the under-layer 601 of the drain electrodes 66 and the storage capacitor conductive patterns 68 through the contact holes 72 and 78 in a stable manner. The contact hole 76 exposing the data pad 64, and the contact holes 72 and 78 exposing the drain electrode 66 and the storage capacitor conductive pattern 68 are formed at the same time in the same shape.

Pixel electrodes 82, subsidiary gate pads 84, subsidiary data pads 86, and subsidiary gate control signal pads 283, 284 and 285 are formed on the protective layer 70 with a transparent conductive material such as ITO.

The pixel electrodes 82 are connected to the drain electrodes 66 and the storage capacitor conductive patterns 68 through the contact holes 72 and 78 to receive picture signals. The subsidiary gate and data pads 84 and 86 are connected to the gate and data pads 24 and 64 through the contact holes 74 and 76 to reinforce adhesion between the pads 24 and 64 and the leads 310 and 410 of the data and gate signal transmission films 300 and 400.

The subsidiary gate control signal pads 283, 284 and 285 are connected to the gate control signal lines 223, 224 and 225 through the contact holes 273, 274 and 275 to reinforce adhesion between the gate control signal lines 223, 224 and 225 and the gate control signal leads 323, 324 and 325 of the data signal transmission film 300.

Meanwhile, gate signal transmission films 400 and data signal transmission films 300 are attached to the above-structured TFT array substrate via an anisotropic conductive film 500 with conductive particles 501 and adhesives 502.

The gate signal leads 410 of the gate signal transmission films 400 are electrically connected to the subsidiary gate pads 84 at the contact portions C1 via the conductive particles 251 of the anisotropic conductive film 250. Furthermore, the data signal leads 310 of the data signal transmission films 300 are electrically connected to the subsidiary data pads 86 at the contact portions C2 via the conductive particles 251 of the anisotropic conductive film 250.

The gate control signal leads 323, 324 and 325 are formed at the data signal transmission film 300, and electrically connected to the gate control signal lines 223, 224 and 225 at the contact portions C3 via the conductive particles 251 of the anisotropic conductive film 250. The gate control signal leads may be divided into a signal lead 323 carrying gate on voltage Von of about 20V, a signal lead 324 carrying gate off voltage Voff of 0V or less, and a signal lead 325 carrying common voltage Vcom of about 7V. The gate control signal leads 323, 324 and 325 electrically contact the gate control signal lines 223, 224 and 225 to transmit gate control signals thereto.

A method for fabricating the liquid crystal display will be now explained with reference to FIGS. 20A to 27E.

First, as shown in FIGS. 20A to 20E, a metallic under-layer 201 is deposited onto an insulating substrate 10 with a conductive material based on chrome or molybdenum, and a metallic over-layer 202 is deposited onto the under-layer 201 with a low resistance material based on aluminum.

The two metallic layers 201 and 202 are etched through photolithography to thereby form a double-layered gate line assembly and double-layered gate control signal lines 223, 224 and 225. The gate line assembly includes gate lines 22, gate pads 24, gate electrodes 26, and storage capacitor electrodes 28.

Thereafter, as shown in FIGS. 21A to 21E, a gate insulating layer 30 is formed on the substrate 10, and semiconductor patterns 42 and 48, ohmic contact patterns 55, 56 and 58, and a double-layered data line assembly are formed on the gate insulating layer 30. The double-lined data line assembly is formed with a metallic under-layer 601 and an aluminum-based over-layer 602.

The data line assembly includes data lines 62, data pads 64, source electrodes 65, drain electrodes 66, and storage capacitor electrodes 68.

The semiconductor patterns are divided into TFT semiconductor patterns 42 and storage capacitor semiconductor patterns 48. The TFT semiconductor patterns 42 have the same shape as the data lines 62, the data pads 64 and the source and drain electrodes 65 and 66 except that they further include TFT channel portions between the source and the drain electrodes 65 and 66.

The data line assembly, the ohmic contact patterns 55, 56 and 58, and the semiconductor patterns 42 and 48 may be formed using only one mask. This photolithography process will be now explained with reference to FIGS. 22A to 25C.

Figure 22C:
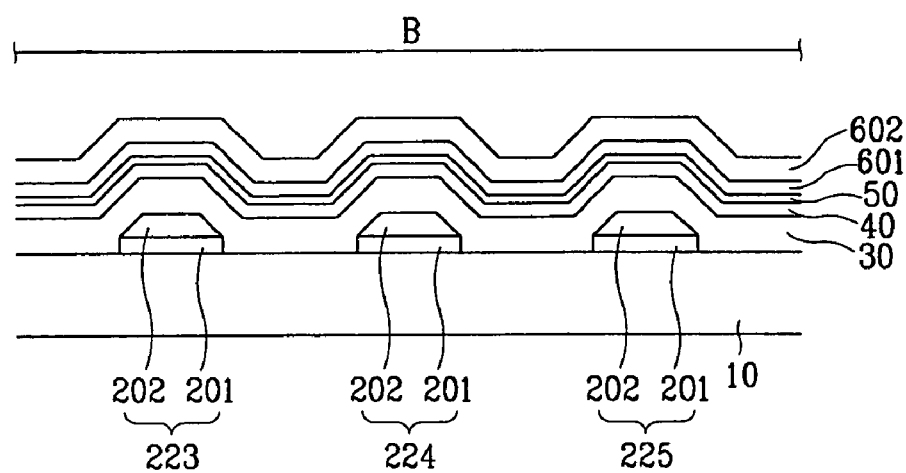

First, as shown in FIGS. 22A to 22C, a gate insulating layer 30, a semiconductor layer 40, and an impurities-doped semiconductor layer 50 are deposited onto the substrate 10 with the gate line assembly through chemical vapor deposition. A metallic under-layer 601, and a metallic over-layer 602 are sequentially deposited onto the impurities-doped semiconductor layer 50, and a photoresist film is coated onto the over-layer 602.

Thereafter, the photoresist film is exposed to light, and developed to thereby form first and second photoresist patterns 112 and 114. The first photoresist pattern 112 is positioned at the data line assembly portion A, and the second photoresist pattern 114 is positioned at the TFT channel portion C between the source and the drain electrodes 65 and 66. The first photoresist pattern 112 is thicker than the second photoresist pattern 112. The remaining portion B has no photoresist film. The thickness ratio of the second photoresist pattern 114 to the first photoresist pattern 112 should be adjusted depending upon the subsequent etching conditions. It is preferable that the thickness of the second photoresist pattern 114 is one half or less of the thickness of the first photoresist pattern 112.

Such photoresist patterns of different thickness are made using a mask with different light transmission. In order to control light transmission, the mask is provided with slit or lattice patterns, or a semi-transparent film. It is preferable that the slit width is smaller than the decomposition capacity of the light exposure. When using a semi-transparent film, thin films of different light transmission or of different thickness may be used to control the light transmission.

When the photoresist film is exposed to light through such a mask, the high molecules of the photoresist film directly exposed to light are completely decomposed, the high molecules of the photoresist film exposed to light through the slit-pattern or the semi-transparent film are slightly decomposed, and the high molecules of the photoresist film exposed to light through the opaque film are barely decomposed. At this time, the light exposing time should be controlled in an appropriate manner such that all of the molecules are not completely decomposed.

When the selectively exposed photoresist film is developed, the non-decomposed molecular portion with a large thickness and the slightly-decomposed molecular portion with a small thickness are left out.

Figure 23C:
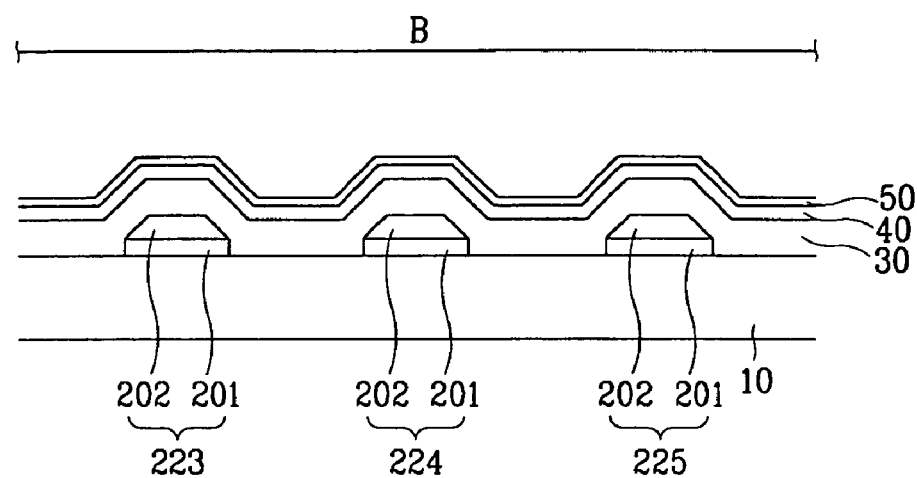

Thereafter, as shown in FIGS. 23A to 23C, the over-layer 602 and the under-layer 601 at the B portion is removed using the photoresist patterns 112 and 114 as a mask while exposing the underlying impurities-doped semiconductor layer 50.

Consequently, the conductive patterns 67 and 68 at the channel portion C and the data line assembly portion A are left out, and the conductive layer at the remaining portion B is removed while exposing the impurities-doped semiconductor layer 50. One of the conductive patterns 68 is a storage capacitor conductive pattern, and the other pattern 67 is a metallic double-layered structure for the data line assembly where the source and the drain electrodes 65 and 66 are not yet separated.

Figure 24C:
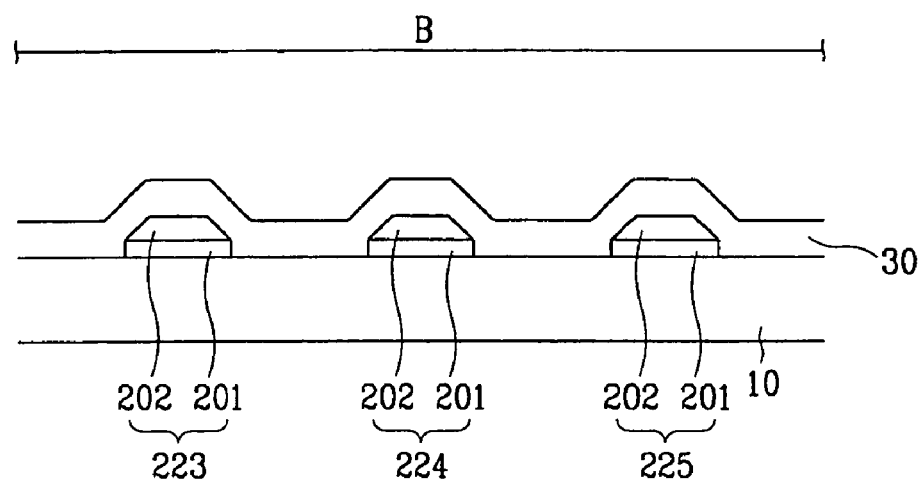

Thereafter, as shown in FIGS. 24A to 24C, the impurities-doped semiconductor layer 50 exposed at the B portion and the underlying semiconductor layer 40 is removed together with the second photoresist pattern 114 through dry etching. The dry etching should be made in condition that the photoresist patterns 112 and 114, the impurities-doped semiconductor layer 50 and the semiconductor layer 40 are etched at the same time while not etching the gate insulating layer 30. Particularly, it is preferable that the photoresist patterns 112 and 114 and the semiconductor layer 40 bear the same etching ratio. For example, a mixture of $SF_6$ and HCl, or a mixture of $SF_6$ and $O_2$ can be used to etch the two layers by the same thickness.

In case the etching ratios with respect to the photoresist patterns 112 and 114 and the semiconductor layer 40 are the same, the thickness of the second photoresist pattern 114 should be the same as the sum in thickness of the semiconductor layer 40 and the impurities-doped semiconductor layer 50, or smaller than the sum.

Consequently, the second photoresist pattern 114 at the channel portion C is removed while exposing the conductive pattern 67, and the impurities-doped semiconductor layer 50 and the semiconductor layer 40 are removed while exposing the gate insulating layer 30. Meanwhile, the first photoresist pattern at the data line assembly portion A is also etched and the thickness becomes decreased.

In this step, the TFT semiconductor patterns 42 and the storage capacitor semiconductor patterns 48 are completed.

Ohmic contact patterns 57 are formed on the TFT semiconductor patterns 42 in the same shape, and ohmic contact patterns 58 are formed on the storage capacitor semiconductor patterns 48 in the same shape.

The photoresist residue on the conductive pattern 67 at the channel portion C is then removed through ashing.

Figure 25C:
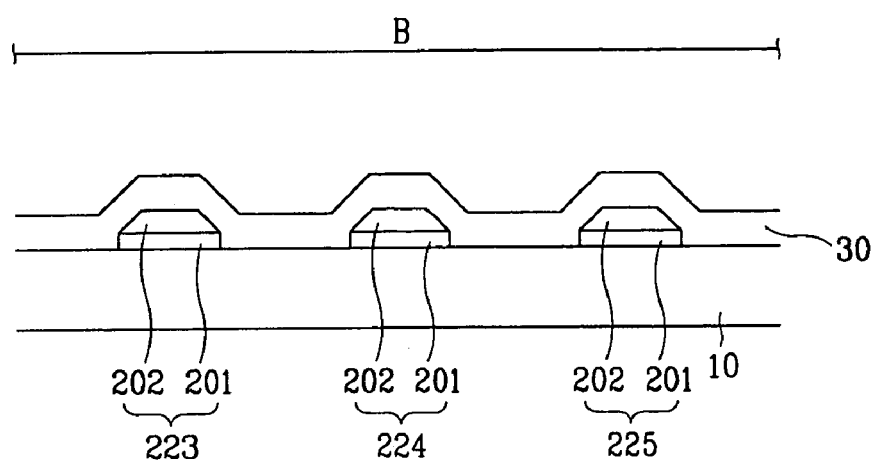
Figure 26A:
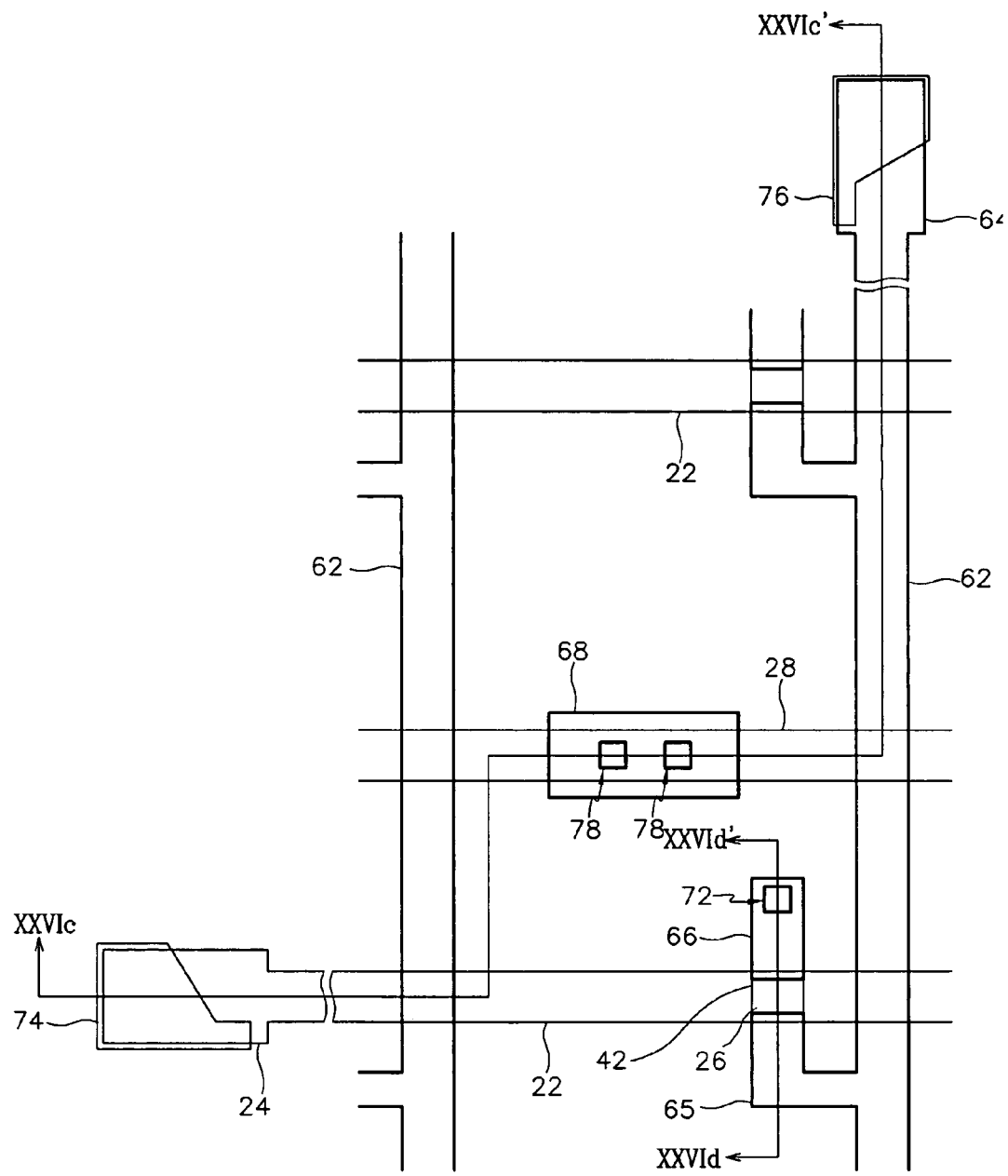
Figure 26B:
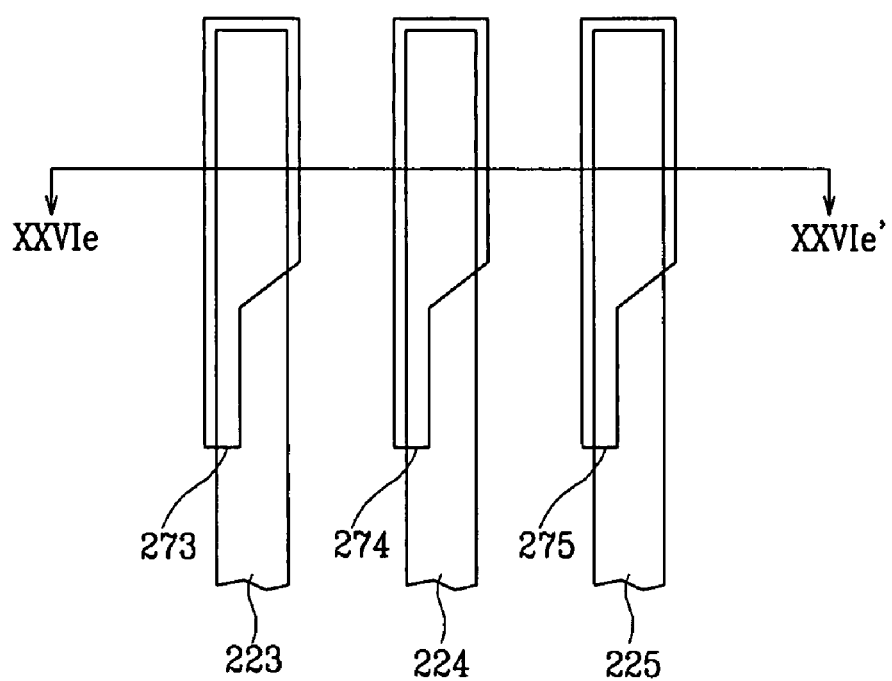
Figure 26C:
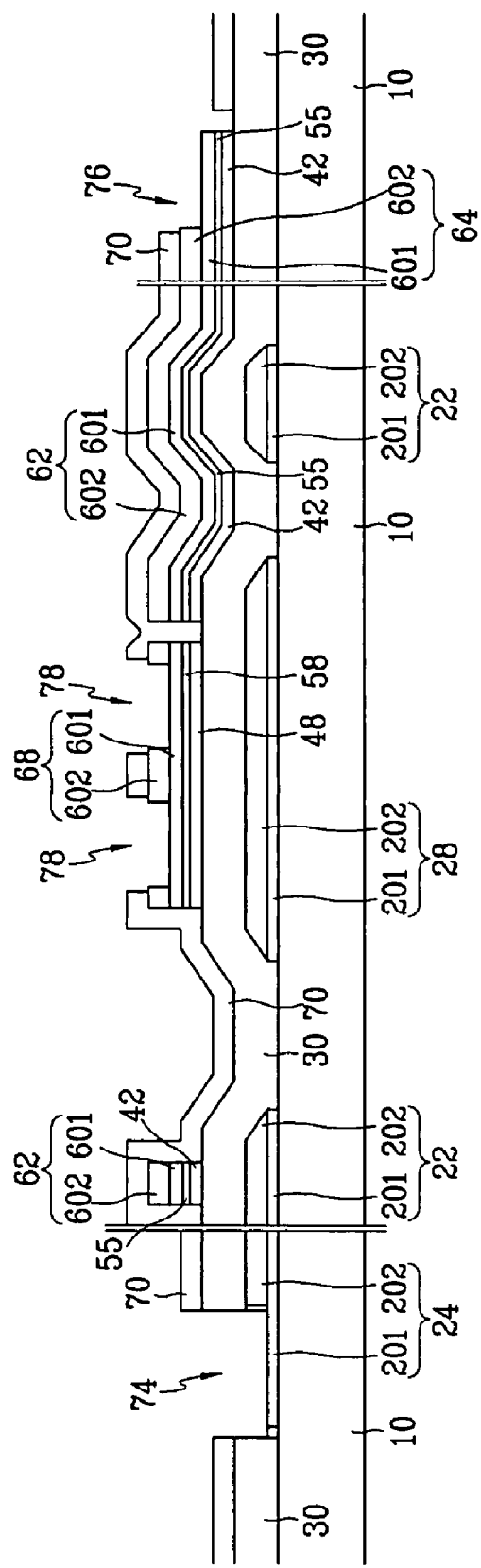
Figure 26E:
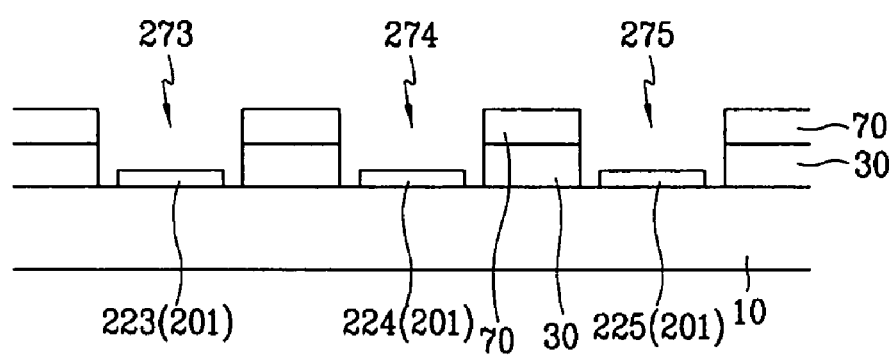
Figure 27A:
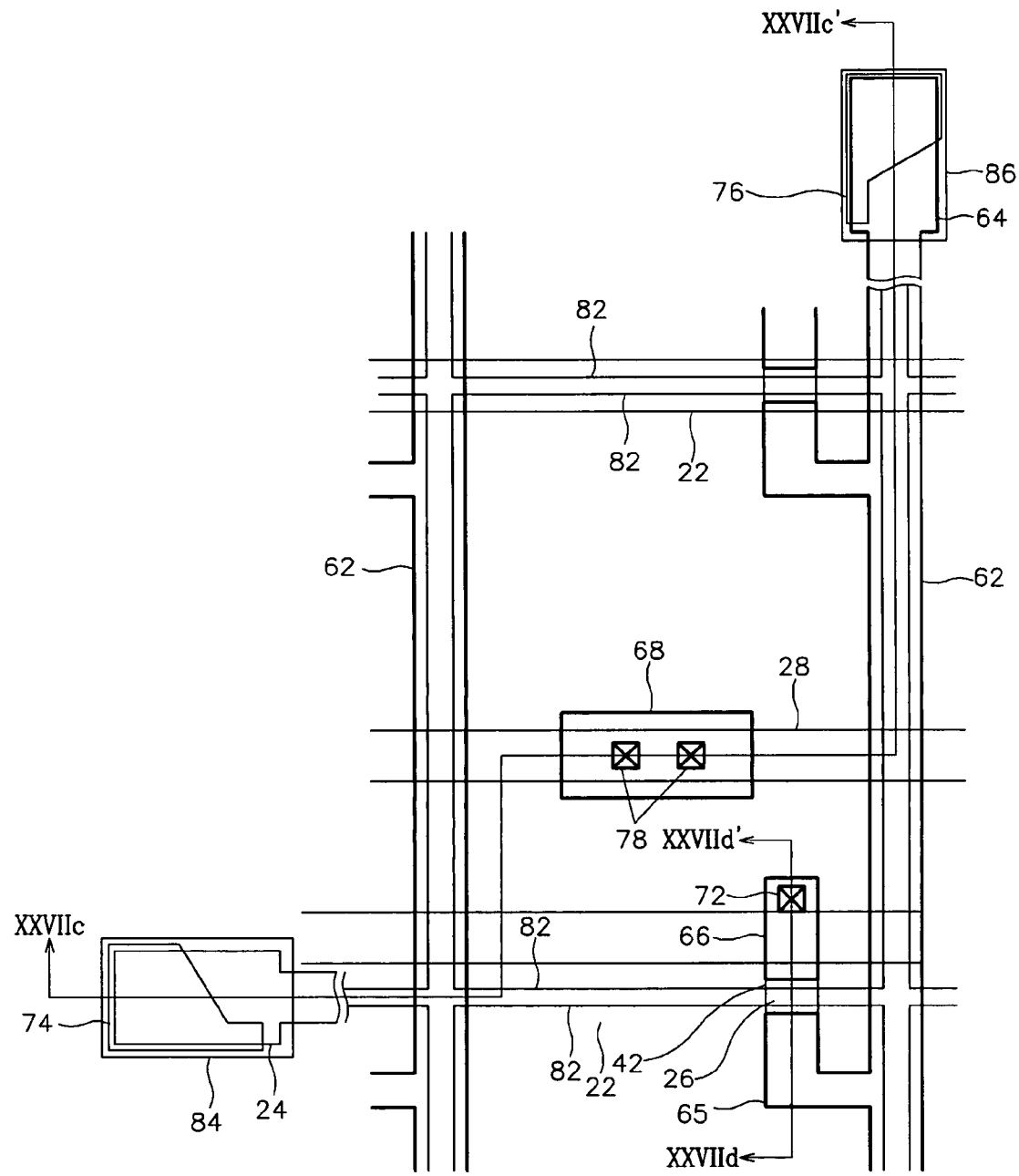
Figure 27B:
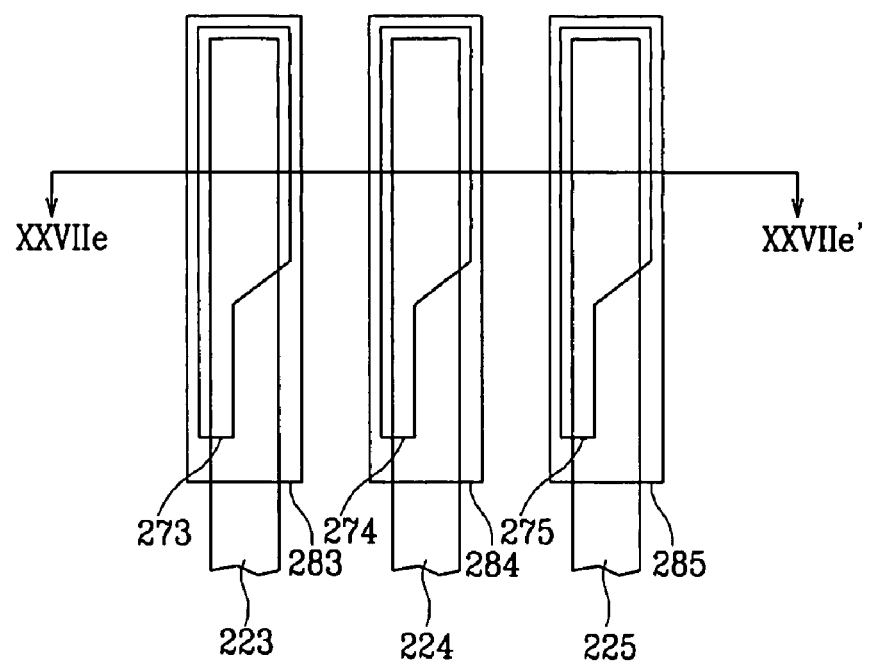
Figure 27C:
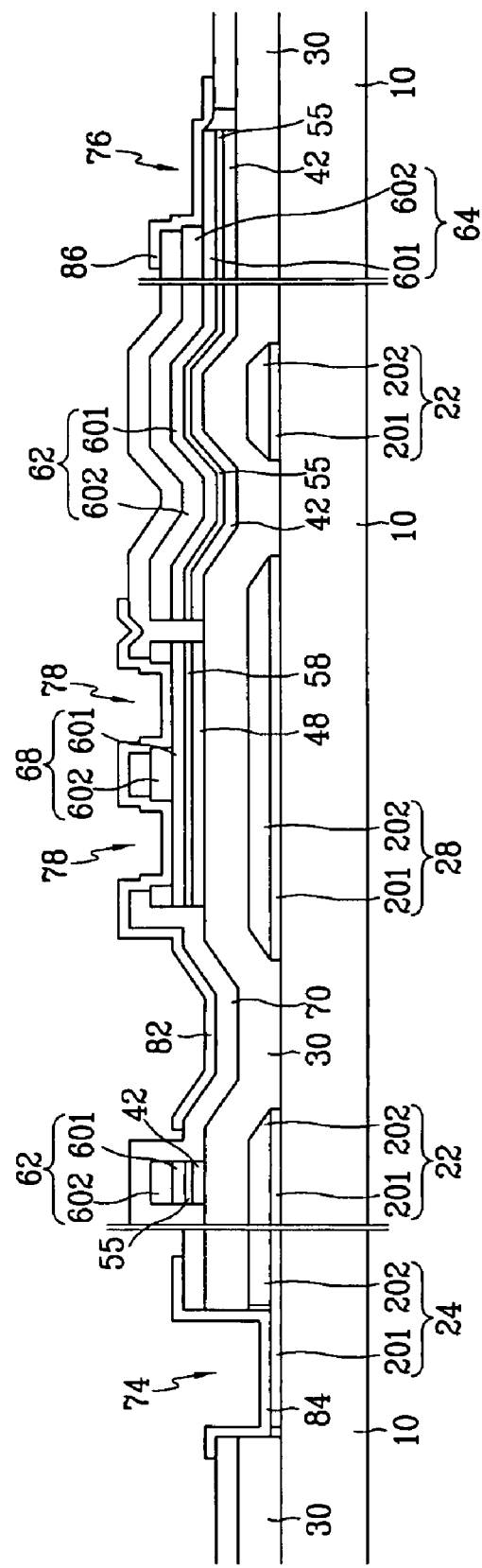
Figure 27D:
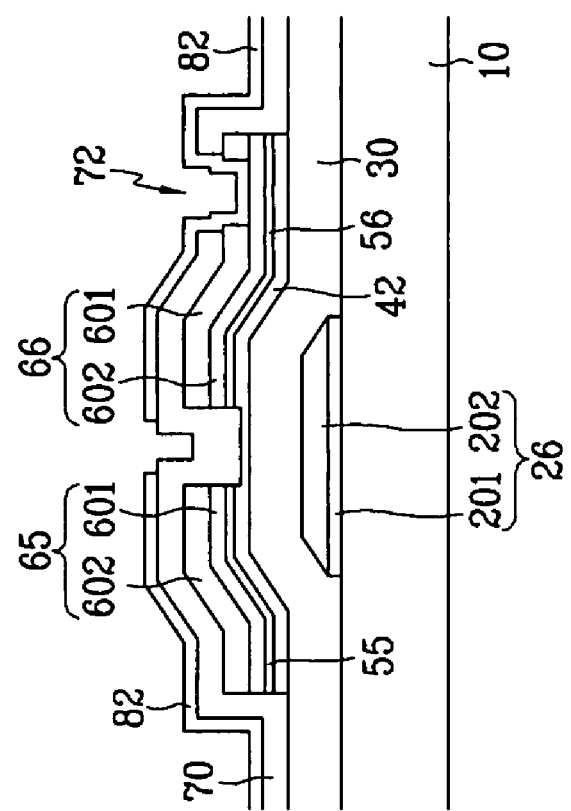
Figure 27E:
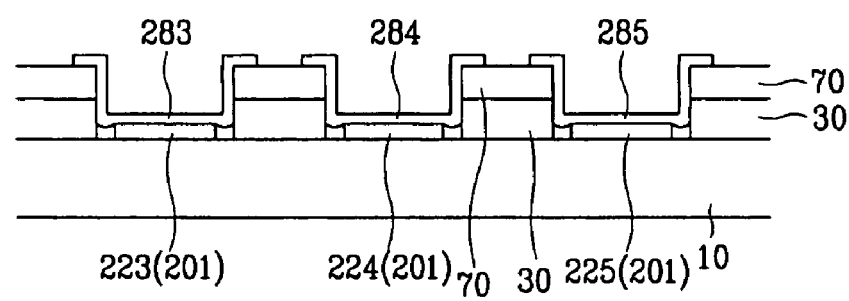

Thereafter, as shown in FIGS. 25A to 25C, the conductive pattern 67 at the channel portion C and the underlying ohmic contact pattern 57 are etched using the first photoresist pattern 112 as a mask, and removed.

At this time, the semiconductor pattern 42 may be reduced in thickness, and the first photoresist pattern 112 are also partially etched. The etching should be made in condition that the gate insulating layer 30 is not etched. Of course, it is preferable that the photoresist pattern is so thick that the photoresist pattern 112 is not completely removed while exposing the underlying data line assembly.

Consequently, the conductive pattern 67 is separated into a source electrode 65 and a drain electrode 66, and the underlying ohmic contact patterns 55, 56 and 58 are completed.

The first photoresist pattern at the data line assembly portion A is removed through ashing.

Thereafter, as shown in FIGS. 26A to 26E, silicon nitride is deposited onto the data line assembly to thereby form a protective layer 70. The protective layer 70, and the gate insulating layer 30 are dry-etched while exposing the aluminum-based over-layers 202 and 602 of the drain electrodes 66, the gate pads 24, the data pads 64, the storage capacitor conductive patterns 68, and the gate control signal lines 223, 224 and 225. The exposed portions of the aluminum-based layers 202 and 602 are wet-etched using an aluminum etching solution, and removed.

In this way, contact holes 74, 273, 274 and 275 exposing the chrome-based under-layers 201 and 601 of the gate pads 24 and the gate control signal lines 223, 224 and 225 are completed.

Thereafter, the protective layer 70 is side-etched while exposing the lateral side of the aluminum-based layer 602 of the drain electrodes 66, the storage capacitor conductive patterns, and the data pads 64, thereby forming stepped contact holes 72, 78 and 76 where the top opening width is larger than the bottom opening width. In this structure, pixel electrodes 82 can contact the drain electrodes 66 and the storage capacitor conductive patterns 68 through the contact holes 72 and 78 in a stable manner.

The contact holes 273, 274 and 275 exposing the signal lines 223, 224 and 225 are longitudinally formed along the shape of the signal lines 223, 224 and 225 such that the lateral side of each contact hole bordering on the gate control signal line has a length longer than the width thereof. Furthermore, the contact holes 74 and 76 exposing the gate and the data pads 24 and 64 are also longitudinally formed along the shape of the gate and data pads 24 and 64 such that the lateral side of each contact hole bordering on the pad has a length longer than the width thereof.

Thereafter, as shown in FIGS. 27A to 27E, an ITO-based transparent material is deposited onto the substrate 10, and etched through photolithography to thereby form pixel electrodes 82 connected to the drain electrodes 66, subsidiary gate and data pads 84 and 86 connected to the gate and data pads 24 and 64, and subsidiary gate control signal pads 273, 274 and 275 connected to the gate control signal lines 223, 224 and 225. The pixel electrodes 82, and the subsidiary pads 84, 86, 273, 274 and 275 directly contact the chrome-based under-layers 201 and 601.

After the TFT array substrate is completed, data and gate signal transmission films 300 and 400 are attached to the TFT array substrate using an anisotropic conductive film 250. At this time, the subsidiary gate pads 84, the subsidiary data pads 86, and the gate control signal lines 223, 224 and 225 are electrically connected to gate signal leads 410, data signal leads 310 and gate control signal leads 323, 324 and 325 of the data and gate signal transmission films 300 and 400 in one to one correspondence.

Alternatively, the contact holes may be structured to be smaller than the relevant lines or pads. That is, the contact hole may be positioned within the area of the relevant lines or pads. The shape of the contact holes may be altered in various manners provided that the lateral side of each contact hole bordering on the line or pad has a length longer than the width of the contact hole.

As described above, in the inventive liquid crystal display, the lateral side of each contact hole bordering on the gate control signal line has a length longer than the width thereof so that the amount of Joule heat due to the voltage drop at the boundary between the contact hole and the relevant line can be reduced, thereby preventing the line opening.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A display device, comprising:
a first substrate;
a first conductive pattern formed on the first substrate and comprising a gate line transmitting a gate signal and a gate control signal line transmitting a gate control signal;
a second conductive pattern formed on the first substrate and comprising a data line interesting the gate line and transmitting a data signal;
a gate driving unit receiving the gate control signal via the gate control signal line and generating the gate signal;
a data driving unit generating the data signal; and
a black matrix overlapping the gate control signal line.

2. The display device of claim 1, further comprising a second substrate facing the first substrate, wherein the black matrix is formed on the second substrate.

3. The display device of claim 2, further comprising a liquid crystal layer formed between the first and the second substrate.

4. The display device of claim 1, further comprising a signal transmission film attached to the first substrate, wherein the data driving unit is mounted on the signal transmission film.

5. The display device of claim 4, wherein the signal transmission film transmits the gate control signal and the data signal to the gate control signal line and the data line, respectively.

6. The display device of claim 1, further comprising:
a thin film transistor formed on the first substrate and connected to the gate line and the data line; and
a third conductive pattern comprising a pixel electrode connected to the thin film transistor and a pad formed on an end of the gate control signal line.

7. The display device of claim 6, further comprising a first insulating film formed on the first conductive pattern and having an opening exposing the end of the gate control signal line.

8. The display device of claim 7, wherein the first conductive pattern has a multi-layered structure comprising a lower layer containing Cr and an upper layer containing Al.

9. The display device of claim 8, wherein a portion of the upper layer of the first conductive pattern is removed at the end portion of the gate control signal line, and the pad is formed directed on the lower layer of the first conductive pattern.

* * * * *